United States Patent
Langhammer et al.

(10) Patent No.: US 10,020,812 B1
(45) Date of Patent: Jul. 10, 2018

(54) TECHNIQUES FOR VARIABLE LATENCY REDUNDANCY

(71) Applicant: Intel Corporation, Santa Clara, CA (US)

(72) Inventors: Martin Langhammer, Alderbury (GB); Dongdong Chen, Union City, CA (US); Jung Ko, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/712,953

(22) Filed: Sep. 22, 2017

(51) Int. Cl.
*H03K 19/17* (2006.01)
*H03K 19/177* (2006.01)
*H03K 19/173* (2006.01)
*H03K 19/0175* (2006.01)

(52) U.S. Cl.
CPC ... *H03K 19/17724* (2013.01); *H03K 19/1738* (2013.01); *H03K 19/0175* (2013.01)

(58) Field of Classification Search
None
See application file for complete search history.

(56) References Cited

U.S. PATENT DOCUMENTS

| | | | | |
|---|---|---|---|---|
| 7,119,576 | B1* | 10/2006 | Langhammer | G06F 7/5443 326/41 |
| 7,346,644 | B1* | 3/2008 | Langhammer | H03K 19/17732 326/38 |
| 8,001,171 | B1* | 8/2011 | Simkins | G06F 17/142 708/404 |
| 8,886,696 | B1 | 11/2014 | Langhammer | |
| 9,207,908 | B1 | 12/2015 | Langhammer | |
| 2010/0228806 | A1* | 9/2010 | Streicher | G06F 17/10 708/203 |
| 2013/0093460 | A1* | 4/2013 | Voogel | H03K 19/17744 326/38 |
| 2016/0342422 | A1* | 11/2016 | Langhammer | G06F 9/3012 |
| 2017/0300337 | A1* | 10/2017 | Langhammer | G06F 9/3867 |
| 2017/0322769 | A1* | 11/2017 | Langhammer | G06F 5/012 |
| 2017/0322813 | A1* | 11/2017 | Langhammer | G06F 9/3826 |

* cited by examiner

*Primary Examiner* — Crystal L Hammond
(74) *Attorney, Agent, or Firm* — Steven J. Cahill

(57) ABSTRACT

An integrated circuit includes first and second circuit blocks. The first circuit block includes a first storage circuit. A first data path passes through the first storage circuit and a first multiplexer circuit to a first input of a first logic circuit. The first multiplexer circuit is coupled to the first storage circuit. A second storage circuit is coupled between the first storage circuit and the first multiplexer circuit. A second data path passes through the second circuit block to a second input of the first logic circuit. The first multiplexer circuit is configurable to bypass or to couple the second storage circuit in the first data path based on an indication of whether a redundant third circuit block is coupled between the first and second circuit blocks in at least one of the first data path or the second data path.

20 Claims, 16 Drawing Sheets

TECHNIQUES FOR VARIABLE LATENCY REDUNDANCY

FIELD OF THE DISCLOSURE

The present disclosure relates to electronic circuits, and more particularly, to techniques for variable latency redundancy in electronic circuits.

BACKGROUND

In a large scale digital circuit such as, but not limited to, a field programmable gate array (FPGA) or an application-specific integrated circuit (ASIC), a number of digital signal processing (DSP) circuit blocks often work together to implement complex tasks. To achieve improved performance, DSP circuit blocks are often operated at high speeds. While FPGA speed, or alternatively the ASIC processing speed, has been improved, one constraint is the propagation delay of signals between two DSP circuit blocks, especially when a random routing distance between the two DSP circuit blocks is encountered, which can be introduced by row based redundancy. When a number of DSP circuit blocks are coupled together, one of the challenges in operating an FPGA is the efficiency of interconnections between the DSP circuit blocks. Once the DSP circuit block has been designed, multiple DSP circuit blocks are coupled together to create a single structure and operated at a high speed, and thus efficient interconnection between the circuit blocks is desired to improve multi-circuit block performance.

DETAILED DESCRIPTION

According to some embodiments disclosed herein, a redundancy system has different amounts of latency, depending on the type of embedded feature that is used in the redundancy system. To improve system performance, one or more additional register circuits may be introduced into a redundancy system in an integrated circuit. The one or more additional register circuits may provide variable latency into one or more data paths in an embedded feature. The variable latency redundancy may be a selectable feature. For example, a register circuit may be selectively bypassed, at the expense of lower system performance. Using the register circuit may increase system complexity, for example, if synthesis and fitter software is not aware of the location and/or number of redundancy hops taken in a data path. If variable latency redundancy is used, then the circuit design for the integrated circuit is able to handle a variable length pipeline for the associated functional circuits in the data path.

According to some embodiments, latency is added to a redundancy system, affecting different parts of a circuit design for an integrated circuit. The registers that provide variable latency can be used without any prior knowledge of the location or use of redundant circuits in the integrated circuit. If a single functional unit of any type is used, variable latency redundancy has no effect on signal timing. The variable latency redundancy only has an effect on signal timing if multiple functional circuits are combined (e.g., across multiple rows, or columns, of circuits, depending on the redundancy orientation).

For some types of circuit blocks, only a small number of signals may cross a redundancy boundary between circuit blocks, which typically makes timing closure easier to achieve (e.g., a carry chain across logic array circuit blocks in an FPGA). For other types of circuit blocks, functionality may be independent of signal routing, even if many functional units are used in the same data path (e.g., memory circuit blocks). In still other types of circuit blocks, multiple large busses may be used to couple together different functional units. These types of circuit blocks are often where timing closure in the circuit design is difficult to achieve (e.g., DSP circuit blocks).

Figure 1:
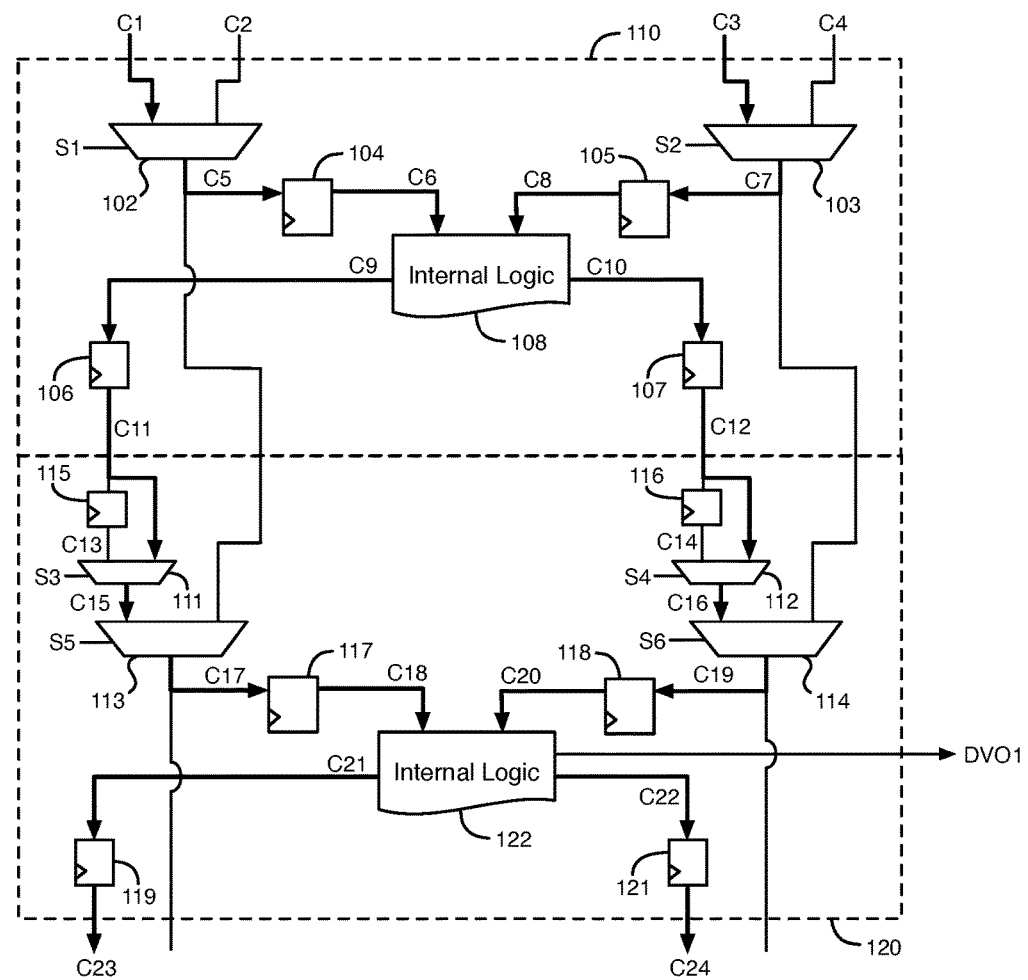
FIG. 1 illustrates examples of two circuit blocks in an integrated circuit that are part of a variable latency redundancy system, according to an embodiment.

FIG. 1 illustrates examples of two circuit blocks 110 and 120 in an integrated circuit that are part of a variable latency redundancy system, according to an embodiment. Circuit blocks 110 and 120 may be in any type of integrated circuit, for example, a programmable logic integrated circuit (IC), a microprocessor IC, or graphics processing unit (GPU) IC. Circuit block 110 includes multiplexer circuits 102-103, register circuits 104-107, and internal logic circuit 108. Circuit block 120 includes multiplexer circuits 111-114, register circuits 115-119 and 121, and internal logic circuit 122. Each of the register circuits 115-116 and each of the other register circuits disclosed herein is a storage circuit that stores a data signal in response to a clock signal.

Internal logic circuits 108 and 122 may contain any types of logic circuits. As examples, internal logic circuits may include arithmetic circuits such as adder circuits and/or multiplier circuits (e.g., in DSP circuit blocks), memory circuits, sequential circuits, and/or combinatorial circuits such as lookup tables (e.g., in logic array circuit blocks). Select signals S1-S6 are provided to select inputs of multiplexer circuits 102, 103, 111, 112, 113, and 114, respectively. Select signals S1-S6 control the selection of the inputs of multiplexer circuits 102, 103, 111, 112, 113, and 114, respectively.

Each of the circuit blocks 110 and 120 may be part of a row or a column of circuit blocks within the integrated circuit. As an example that is not intended to be limiting, each of circuit blocks 110 and 120 may be in a row or column of digital signal processing (DSP) circuit blocks, memory circuit blocks, and/or logic array circuit blocks in a programmable logic integrated circuit.

As shown in Figure (FIG. 1, two additional register circuits 115 and 116 have been coupled into the data paths between the outputs of internal logic circuit 108 and the inputs of internal logic circuit 122 to provide additional latency for the redundancy system. Also, two additional multiplexer circuits 111-112 have been coupled to register circuits 115-116, respectively, to provide optional bypass data paths around register circuits 115-116. By providing these optional bypass data paths around register circuits 115-116, multiplexer circuits 111-112 allow the latency of the redundancy system to be variable. Register circuits 106 and 115 are coupled in series, and the outputs of register circuits 106 and 115 are coupled to different inputs of multiplexer circuit 111. Register circuits 107 and 116 are coupled in series, and the outputs of register circuits 107 and 116 are coupled to different inputs of multiplexer circuit 112.

In the example shown in FIG. 1, neither circuit block 110 nor circuit block 120 contains a defect or is a redundant circuit block. Therefore, the additional latency provided by register circuits 115-116 is not needed. Select signals S3-S4 are set to logic states that cause multiplexer circuits 111-112 to provide the output signals C11 and C12 of register circuits 106 and 107 to inputs of multiplexer circuits 113-114 as signals C15-C16, respectively, bypassing register circuits 115-116.

Each signal, register circuit, and multiplexer circuit shown in the Figures may represent one, two, three, four, five, or more signals, register circuits, and multiplexer circuits, respectively. Each signal line shown in the Figures may be one signal line or a bus that includes multiple signal lines. The data paths through circuit blocks 110 and 120 that are selected by the multiplexer circuits in response to select signals S1-S6 are shown by bolded arrows in FIG. 1. The data paths through circuit blocks 110 and 120 in the example of FIG. 1 are now described in detail.

The data indicated by input signals C1 and C3 is provided by multiplexer circuits 102-103 to register circuits 104-105 as signals C5 and C7 in response to select signals S1-S2, respectively. Register circuits 104-105 store the data indicated by signals C5 and C7 as signals C6 and C8, respectively, in response to a clock signal. Internal logic circuit 108 processes the data indicated by signals C6 and C8 to generate output data in signals C9 and C10. Register circuits 106-107 store the data indicated by signals C9 and C10 as signals C11 and C12, respectively, response to a clock signal.

As mentioned above, multiplexer circuits 111-112 provide the data indicated by signals C11 and C12 to inputs of multiplexer circuits 113-114 as signals C15-C16, respectively, bypassing register circuits 115-116. Multiplexer circuits 113-114 provide the data indicated by signals C15 and C16 to register circuits 117-118 as signals C17 and C19 in response to select signals S5-S6, respectively. Register circuits 117-118 store the data indicated by signals C17 and C19 as signals C18 and C20, respectively, in response to a clock signal. Internal logic circuit 122 processes the data indicated by signals C18 and C20 to generate output data in signals C21 and C22. Register circuits 119 and 121 store the data indicated by signals C21 and C22 as signals C23 and C24, respectively, in response to a clock signal.

Internal logic circuit 122 generates a data valid output signal DVO1. Signal DVO1 indicates when the data output signals C21 and C22 of internal logic circuit 122 are valid. The data valid output signal DVO1 indicates when a redundant circuit block (or redundant row/column of circuit blocks) is being used in the data paths, and if the pipeline for a data path contains a bubble. Because circuit blocks 110 and 120 are not redundant in the example of FIG. 1, the data valid output signal DVO1 may continuously remain in a state that indicates that the output signals C21 and C22 contain valid data.

Figure 2:
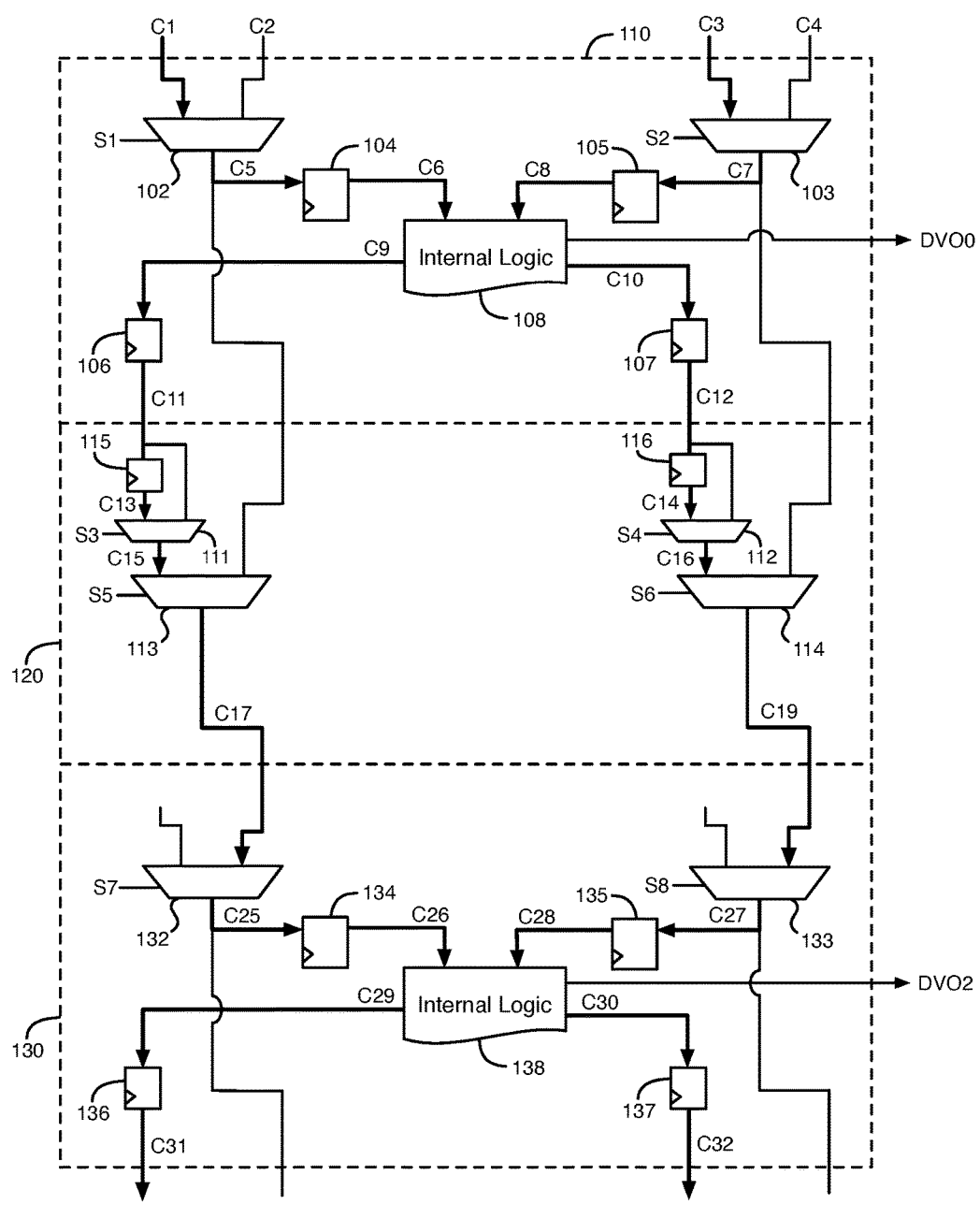
FIG. 2 illustrates examples of three circuit blocks in an integrated circuit that implement a variable latency redundancy system, according to an embodiment.

FIG. 2 illustrates examples of three circuit blocks 110, 120, and 130 in an integrated circuit that implement a variable latency redundancy system, according to an embodiment. Circuit blocks 110 and 120 are described above with respect to FIG. 1. Register circuits 117-119 and 121 and internal logic circuit 122 are not shown in FIG. 2. The third circuit block 130 shown in FIG. 2 includes multiplexer circuits 132-133, register circuits 134-137, and internal logic circuit 138. Select signals S7-S8 control the selection of the inputs of multiplexer circuits 132-133, respectively.

Circuit block 130 is in the same integrated circuit (IC) as circuit blocks 110 and 120. Circuit blocks 110, 120, and 130 may be in a first row (or column) of circuit blocks, a second row (or column) of circuit blocks, and a third row (or column) of circuit blocks, respectively. The other circuit blocks in each of the three rows or columns are not shown in FIG. 2. Internal logic circuit 138 may contain any types of logic circuits, such as arithmetic circuits, memory circuits, sequential circuits, and/or combinatorial circuits.

In the example shown in FIG. 2, internal logic circuit 122, one or more of register circuits 117-119 or 121, and/or the routing wires between these circuits in circuit block 120 contain one or more defects. Because at least one of these circuits or wires in circuit block 120 contains a defect in the example of FIG. 2, the data paths through circuit blocks 110, 120, and 130 bypass these circuits and wires. Circuit block 120 or 130 functions as a redundant circuit block in the redundancy system in that internal logic circuit 138 takes the place of internal logic circuit 122, and register circuits 134-137 take the place of register circuits 117-119 and 121, respectively. Circuit block 120 or 130 may, for example, be in a redundant row or redundant column of circuit blocks.

In the example of FIG. 2, the additional latency provided by register circuits 115-116 is used to reduce the maximum delays between registers in the data paths through circuit blocks 110, 120, and 130. Without register circuits 115-116, there may not be any sequential timing circuits in the data paths that pass through the defective circuit block 120, which may increase the maximum register-to-register delays. In the example of FIG. 2, select signals S3-S4 are set to logic states that cause multiplexer circuits 111-112 to provide the output signals C13 and C14 of register circuits 115-116 to inputs of multiplexer circuits 113-114 as signals C15-C16, respectively. The addition of register circuits 115-116 and multiplexer circuits 111-112 in the data paths does add latency to the data that pass from the outputs of internal logic 108 and to the inputs of internal logic 138. This additional latency may be compensated for in the signal timing analysis that is used to characterize circuit blocks 110, 120, and 130.

The data paths through circuit blocks 110 and 120 that are selected by the multiplexer circuits in response to select signals S1-S8 are shown by bolded arrows in FIG. 2. The data paths through the circuit blocks of FIG. 2 are now described in detail. The data indicated by signals C1 and C3 is provided to internal logic circuit 108, and the output data of internal logic circuit 108 is provided to signals C11 and C12 as described above with respect to FIG. 1.

Register circuits 115-116 store the data indicated by signals C11 and C12 as signals C13 and C14, respectively, in response to a clock signal. Multiplexer circuits 111-112 provide the data indicated by signals C13 and C14 to inputs of multiplexer circuits 113-114 as signals C15-C16 in response to select signals S3-S4, respectively. Multiplexer circuits 113-114 provide the data indicated by signals C15 and C16 to multiplexer circuits 132-133 as signals C17 and C19 in response to select signals S5-S6, respectively.

Multiplexer circuits 132-133 provide the data indicated by signals C17 and C19 to register circuits 134-135 as signals C25 and C27 in response to select signals S7-S8, respectively. Register circuits 134-135 store the data indicated by signals C25 and C27 as signals C26 and C28, respectively, in response to a clock signal. Internal logic circuit 138 processes the data indicated by signals C26 and C28 to generate output data in signals C29-C30. Register circuits 136-137 store the data indicated by signals C29 and C30 as signals C31 and C32, respectively, in response to a clock signal. Signals C31 and C32 may be provided to a fourth circuit block (not shown) in a fourth row or column.

Because almost any circuit block in an IC can be redundant, many, most or all circuit blocks in an IC may generate data valid output signals. As examples, internal logic circuit 108 generates a data valid output signal DVO0, and internal logic circuit 138 generates a data valid output signal DVO2. Data valid output signal DVO0 indicates when data output signals C9 and C10 are valid. Data valid output signal DVO2 indicates when data output signals C29 and C30 are valid. Data valid output signal DVO2 may indicate that a redundant circuit block 130 is being used to replace circuitry in a defective circuit block (i.e., circuit block 120). Signal DVO2 also indicates that there are bubbles in the data paths through circuit block 120 (e.g., the additional latency added by register circuits 115-116). As an example that is not intended to be limiting, signal DVO2 may be set to a logic low state when the output data signals of internal logic circuit 138 are not valid and to a logic high state when the output data signals of internal logic circuit 138 are valid. Internal logic circuit 138 may, for example, set signal DVO2 to a logic low state indicating invalid output data signals for one clock cycle to compensate for the additional latency added by register circuits 115-116 into the data paths.

In some embodiments, not every connection in a data path that has a redundant circuit block contains an additional register circuit, such as register circuit 115 or 116. As examples that are not intended to be limiting, connections between some types of circuit blocks (such as between logic array circuit blocks or general purpose routing wires) may not contain additional register circuits 115-116. Digital signal processing (DSP) circuit blocks that contain adders and/or multiplier circuits may be examples of functional units that contain the registered redundancy shown in FIGS. 1-2. DSP circuit blocks can be combined sequentially, or out of sequence (such as in reduction structures).

FIGS. 1 and 2 are examples of sequential combinations of circuit blocks using a variable latency redundancy system. Out of sequence combinations of circuit blocks may also use variable latency redundancy systems. The same type of circuit block or different types of circuit blocks may be combined out of sequence with a variable latency redundancy system. FIGS. 3-15 illustrate various embodiments of digital signal processing (DSP) circuit blocks that utilize variable latency redundancy systems as illustrative examples. DSP circuit blocks are disclosed herein as examples and are not intended to be limiting.

Figure 3:
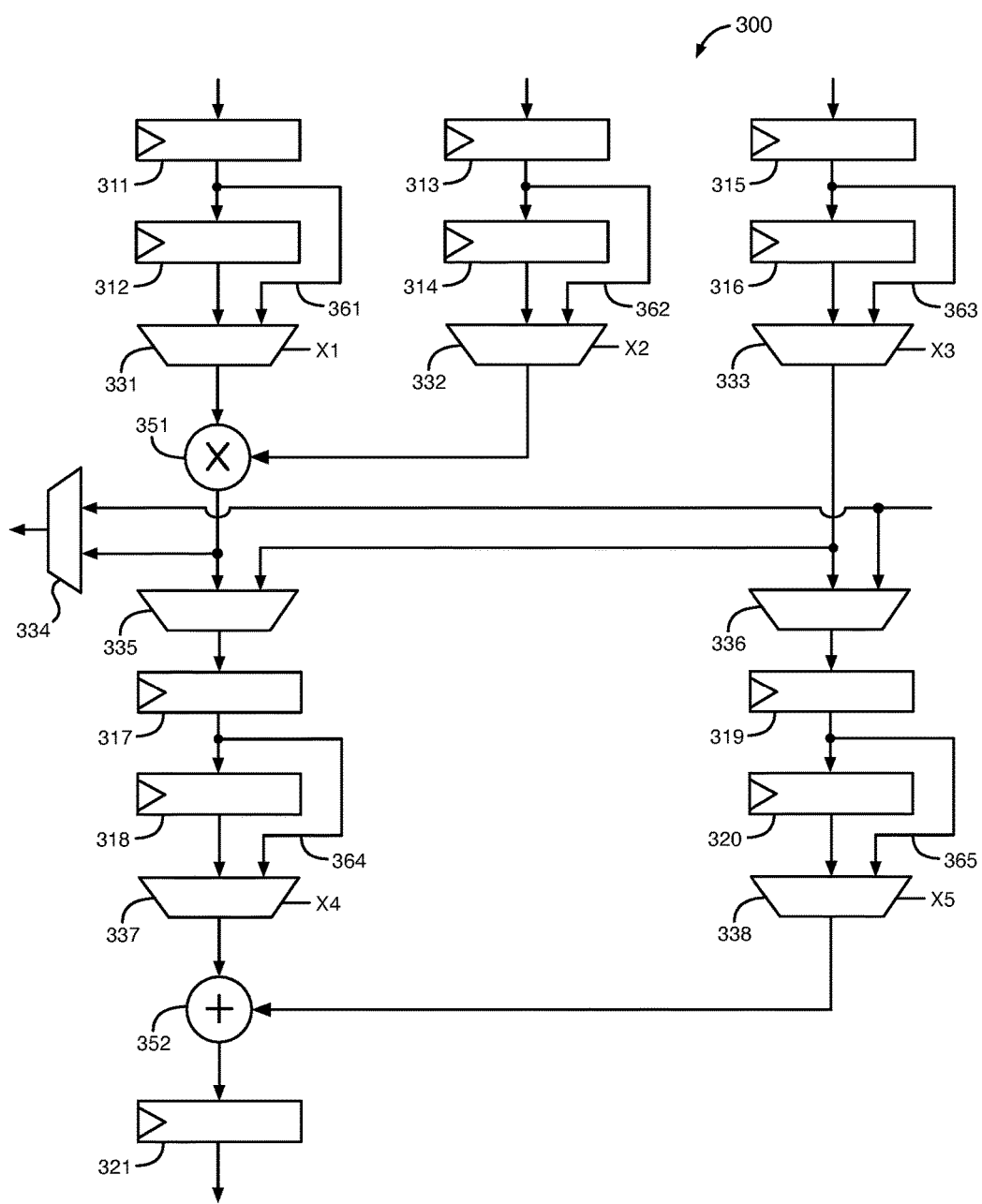
FIG. 3 illustrates one example of a digital signal processing (DSP) circuit block that includes a variable latency redundancy system, according to an embodiment.

FIG. 3 illustrates one example of a digital signal processing (DSP) circuit block 300 that includes a variable latency redundancy system, according to an embodiment. DSP circuit block 300 includes register circuits 311-321, multiplexer circuits 331-338, multiplier circuit 351, and adder circuit 352. DSP circuit block 300 may be in an integrated circuit such as a programmable logic IC, a microprocessor IC, or a graphics processing unit IC. DSP circuit block 300 may be combined in both sequential and out of sequence circuit structures. The multiplier circuit 351 and the adder circuit 352 may be accessible from both inside and outside DSP circuit block 300.

The select inputs of multiplexer circuits 331-333 and 337-338 are controlled by select signals X1-X5, respectively. Register circuits 312, 314, 316, 318, and 320 in circuit block 300 may be bypassed by setting the select signals X1-X5 to cause multiplexer circuits 331, 332, 333, 337, and 338 to select bypass data paths 361-365, respectively. Because multiplexer circuits 331-333 and 337-338 are controlled by 5 separate select signals X1-X5, each of the register circuits 312, 314, 316, 318, and 320 may be bypassed independently of the other register circuits in circuit block 300. One or more of register circuits 312, 314, 316, 318, and 320 can be added to the data paths or bypassed to implement variable latency redundancy. Additional register circuits may also be provided in block 300 for balancing the effects of variable latency redundancy.

Multiple DSP circuit blocks with a variable latency redundancy system may be arranged in a row or column, so that information can be fed from one DSP circuit block to the next to create more complex circuit structures. An exemplary implementation of digital signal processing (DSP) circuit blocks that have a variable latency redundancy system is for a recursive reduction tree. A recursive reduction tree has a complex out of order combination, but a recursive reduction tree can nevertheless be readily supported with DSP circuit blocks having a variable latency redundancy system.

Figure 4:
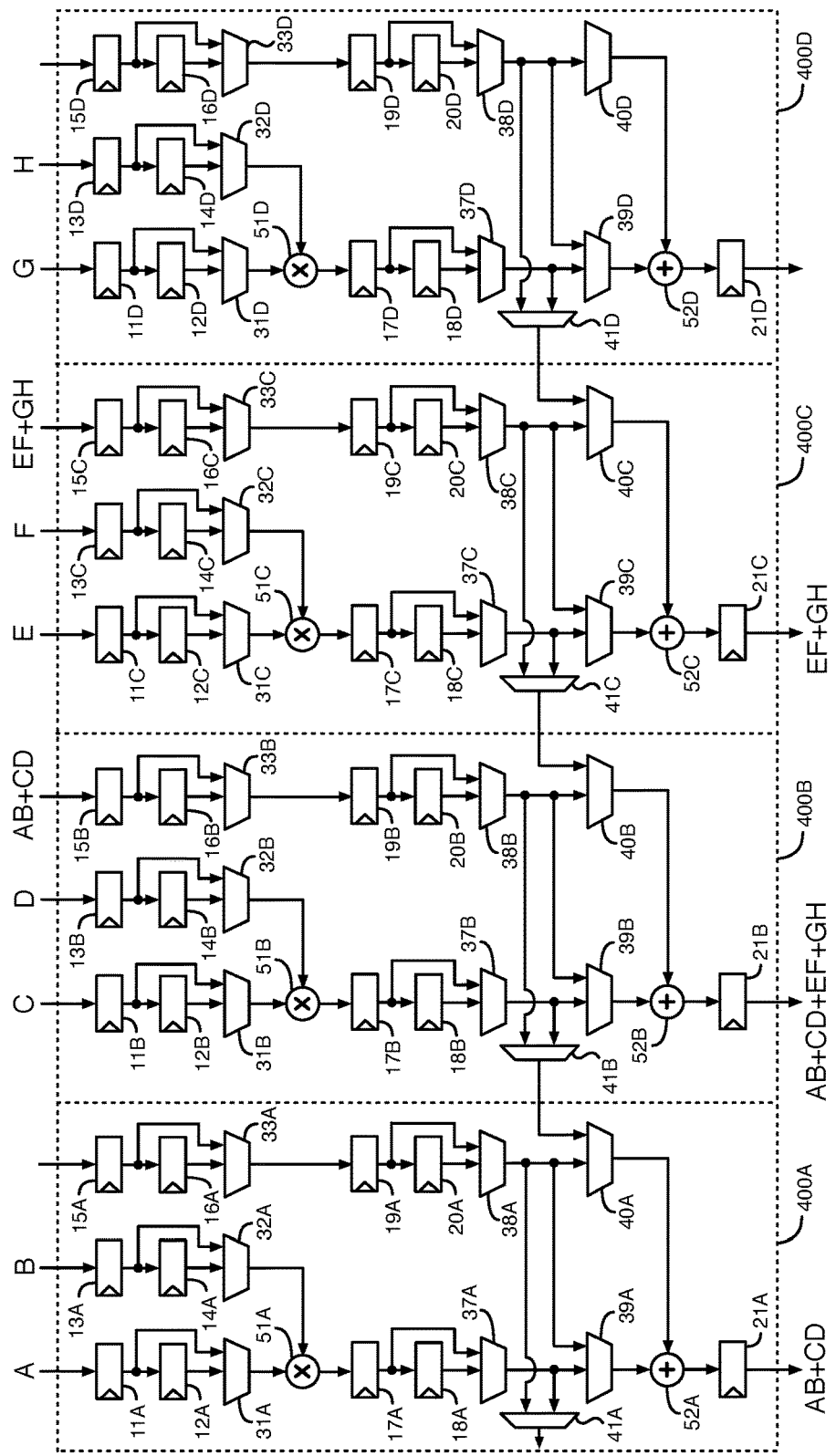
FIG. 4 illustrates four exemplary DSP circuit blocks configured as a recursive reduction tree that performs a dot product operation using variable latency redundancy, according to an embodiment.

FIG. 4 illustrates four exemplary DSP circuit blocks 400A-400D configured as a recursive reduction tree that performs a dot product operation using variable latency redundancy, according to an embodiment. DSP circuit blocks 400A-400D may be arranged in one or more rows or columns without changing the connections between the inputs and outputs. DSP circuit blocks 400A-400D may be in an integrated circuit such as a programmable logic IC, a microprocessor IC, or a graphics processing unit IC.

DSP circuit blocks 400A-400D include register circuits 11A-11D, 12A-12D, 13A-13D, 14A-14D, 15A-15D, 16A-16D, 17A-17D, 18A-18D, 19A-19B, 20A-20D, and 21A-21D, respectively. DSP circuit blocks 400A-400D also include multiplexer circuits 31A-31D, 32A-32D, 33A-33D, 37A-37D, 38A-38D, 39A-39D, 40A-40D, and 41A-41D, respectively. DSP circuit blocks 400A-400D also include multiplier circuits 51A-51D and adder circuits 52A-52D, respectively. The multiplier circuits 51 and the adder circuits 52 are arithmetic logic circuits.

In some embodiments, register circuits 11A-11D, 12A-12D, 13A-13D, 14A-14D, 15A-15D, 16A-16D, 17A-17D, 18A-18D, 19A-19B, 20A-20D, and 21A-21D are all clocked by the same clock signal or by clock signals that are derived from the same clock source (e.g., a phase-locked or delay-locked loop). Although the discussion below refers to each of the register circuits as having a latency of one clock cycle, it should be understood that in alternative embodiments one or more of the register circuits may have a latency of a fraction of a clock cycle or multiple clock cycles.

DSP circuit blocks 400A-400D multiply two vectors X=(A, C, E, G) and Y=(B, D, F, H). DSP circuit blocks 400A-400D receive the elements A, C, E, and G of vector X at the inputs of register circuits 11A-11D, respectively. DSP circuit blocks 400A-400D receive the elements B, D, F, and H of vector Y at the inputs of register circuits 13A-13D, respectively, as shown in FIG. 4. Because there are four elements in each of vectors X and Y, multiplication of vectors X and Y requires four DSP circuit blocks 400A-400D.

In each pair of DSP circuit blocks 400A-400B and 400C-400D, the multiplier circuit 51 in each DSP circuit block, along with the adder circuit 52A, 52C in the leftmost DSP circuit block 400A, 400C of the two DSP circuit block pairs, implement a respective sum (AB+CD and EF+GH) of two multiplication operations. Those sums are added together with the adder circuit 52B of DSP circuit block 400B. Sum EF+GH is routed to adder 52B through multiplexer circuits 40B and 41C. Sum AB+CD is routed to adder 52B through multiplexer circuits 38B and 39B. Adder circuit 52B thereby outputs a sum of four multiplication operations, i.e., AB+CD+EF+GH. For an N number of multiplier circuits 51, there are an N number of adder circuits 52 in the circuit structure of FIG. 4. The circuit structure of FIG. 4 implements a recursive reduction tree for a dot product operation, which, for a pair of vectors of length N, is the sum of an N number of multiplication operations. The summation of N multiplication operations requires N−1 adders. The Nth adder is unused.

Figure 5:
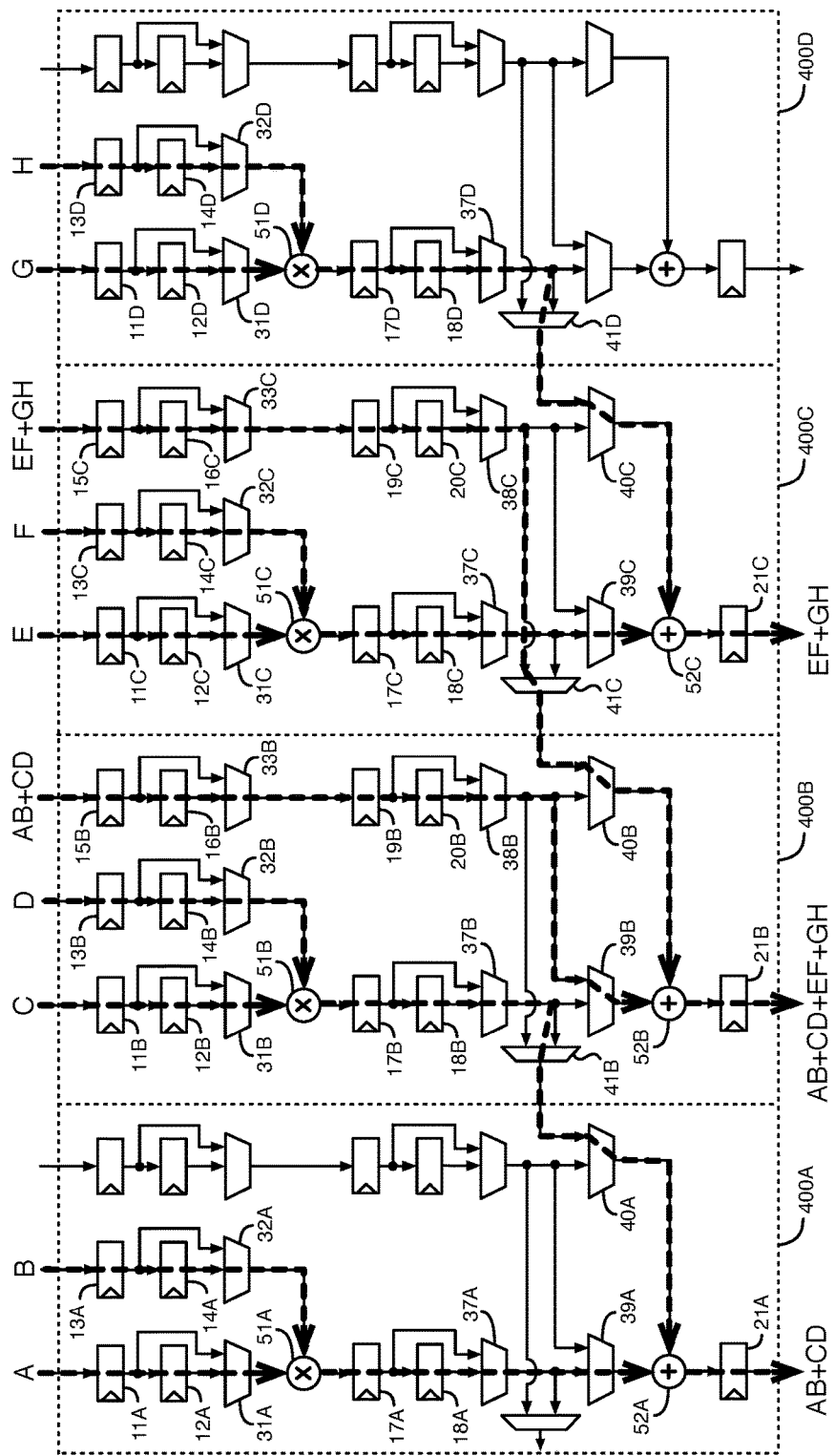
FIG. 5 illustrates an exemplary selection of data paths through DSP circuit blocks for the dot product operation example disclosed in connection with FIG. 4, according to an embodiment.

FIG. 5 illustrates an exemplary selection of data paths through DSP circuit blocks 400A-400D for the dot product operation example disclosed in connection with FIG. 4, according to an embodiment. The data paths selected by the multiplexer circuits in DSP circuit blocks 400A-400D are shown by bolded dotted lines and arrows in FIGS. 5-11 and 15, according to various embodiments. The multiplexer circuits in DSP circuit blocks 400A-400D select the data paths shown by the bolded dotted lines and arrows in FIGS. 5-11 and 15 in response to select signals that control the selection of the multiplexer inputs.

In the embodiment of FIG. 5, input A to DSP circuit block 400A is routed to multiplier circuit 51A through register circuits 11A and 12A and multiplexer circuit 31A. Input B to DSP circuit block 400A is routed to multiplier circuit 51A through register circuits 13A and 14A and multiplexer circuit 32A. Multiplier circuit 51A multiplies A and B to generate a product AB that is routed to a first input of adder circuit 52A through register circuits 17A and 18A and multiplexer circuits 37A and 39A.

Input C to DSP circuit block 400B is routed to multiplier circuit 51B through register circuits 11B and 12B and multiplexer circuit 31B. Input D to DSP circuit block 400B is routed to multiplier circuit 51B through register circuits 13B and 14B and multiplexer circuit 32B. Multiplier circuit 51B multiplies C and D to generate a product CD that is routed to a second input of adder circuit 52A in circuit block 400A through register circuits 17B and 18B and multiplexer circuits 37B, 41B, and 40A.

Adder circuit 52A adds the product AB to the product CD to generate a sum AB+CD that is routed to the output of DSP circuit block 400A through register circuit 21A. The sum AB+CD is then routed to an input of register circuit 15B in DSP circuit block 400B through a conductor or conductors that are not shown in FIG. 5. Sum AB+CD is then routed to a first input of adder circuit 52B through register circuits 15B and 16B, multiplexer circuit 33B, register circuits 19B and 20B, and multiplexer circuits 38B and 39B.

Input E to DSP circuit block 400C is routed to multiplier circuit 51C through register circuits 11C and 12C and multiplexer circuit 31C. Input F to DSP circuit block 400C is routed to multiplier circuit 51C through register circuits 13C and 14C and multiplexer circuit 32C. Multiplier circuit 51C multiplies E and F to generate a product EF that is routed to a first input of adder circuit 52C through register circuits 17C and 18C and multiplexer circuits 37C and 39C.

Input G to DSP circuit block 400D is routed to multiplier circuit 51D through register circuits 11D and 12D and multiplexer circuit 31D. Input H to DSP circuit block 400D is routed to multiplier circuit 51D through register circuits 13D and 14D and multiplexer circuit 32D. Multiplier circuit 51D multiplies G and H to generate a product GH that is routed to a second input of adder circuit 52C in circuit block 400C through register circuits 17D and 18D and multiplexer circuits 37D, 41D, and 40C.

Adder circuit 52C adds the product EF to the product GH to generate a sum EF+GH that is routed to the output of DSP circuit block 400C through register circuit 21C. The sum EF+GH is then routed to an input of register circuit 15C in DSP circuit block 400C through a conductor or conductors that are not shown in FIG. 5. The sum EF+GH is then routed to a second input of adder circuit 52B through register circuits 15C and 16C, multiplexer circuit 33C, register circuits 19C and 20C, and multiplexer circuits 38C, 41C, and 40B. Adder circuit 52B adds the sum AB+CD to the sum EF+GH to generate a sum AB+CD+EF+GH that is routed to the output of DSP circuit block 400B through register circuit 21B. The sum AB+CD+EF+GH is the result of the dot product multiplication of vectors X and Y. In some embodiments, the sum AB+CD+EF+GH may be routed to additional DSP circuit blocks 400 to perform additional portions of a dot product multiplication of two vectors that each have five or more elements.

DSP circuit blocks 400A-400D include a variable latency redundancy system. The variable latency redundancy system is implemented by multiplexer circuits and pairs of register circuits that are coupled in series in each of the DSP circuit blocks 400A-400D. One of the multiplexer circuits is coupled to the output of each register circuit in each pair of the register circuits. The register circuits and the multiplexer circuits that may be part of the redundancy system shown in FIGS. 4-15 include, for example, register circuits 11A-11D, 12A-12D, 13A-13D, 14A-14D, 15A-15D, 16A-16D, 17A-17D, 18A-18D, 19A-19D, and 20A-20D and multiplexer circuits 31A-31D, 32A-32D, 33A-33D, 37A-37D, and 38A-38D. Each of the DSP circuit blocks 400A-400D includes 5 pairs of series-coupled register circuits. For example, in DSP circuit block 400A, register circuits 11A and 12A are coupled in series.

Each of these multiplexer circuits may be configured to selectively couple or bypass one of the register circuits in each pair of the register circuits in a data path in order to provide variable latency to the data path. The latency of one or more data paths through the DSP circuit blocks 400A-400D may be varied in order to compensate for the latency of a redundant DSP circuit block coupled between two of the DSP circuit blocks 400A-400D. For example, a multiplexer circuit may bypass one of the register circuits in a pair of the register circuits in a data path in order to compensate for the extra latency added into the data path by a register circuit in a redundant DSP circuit block.

Figure 6:
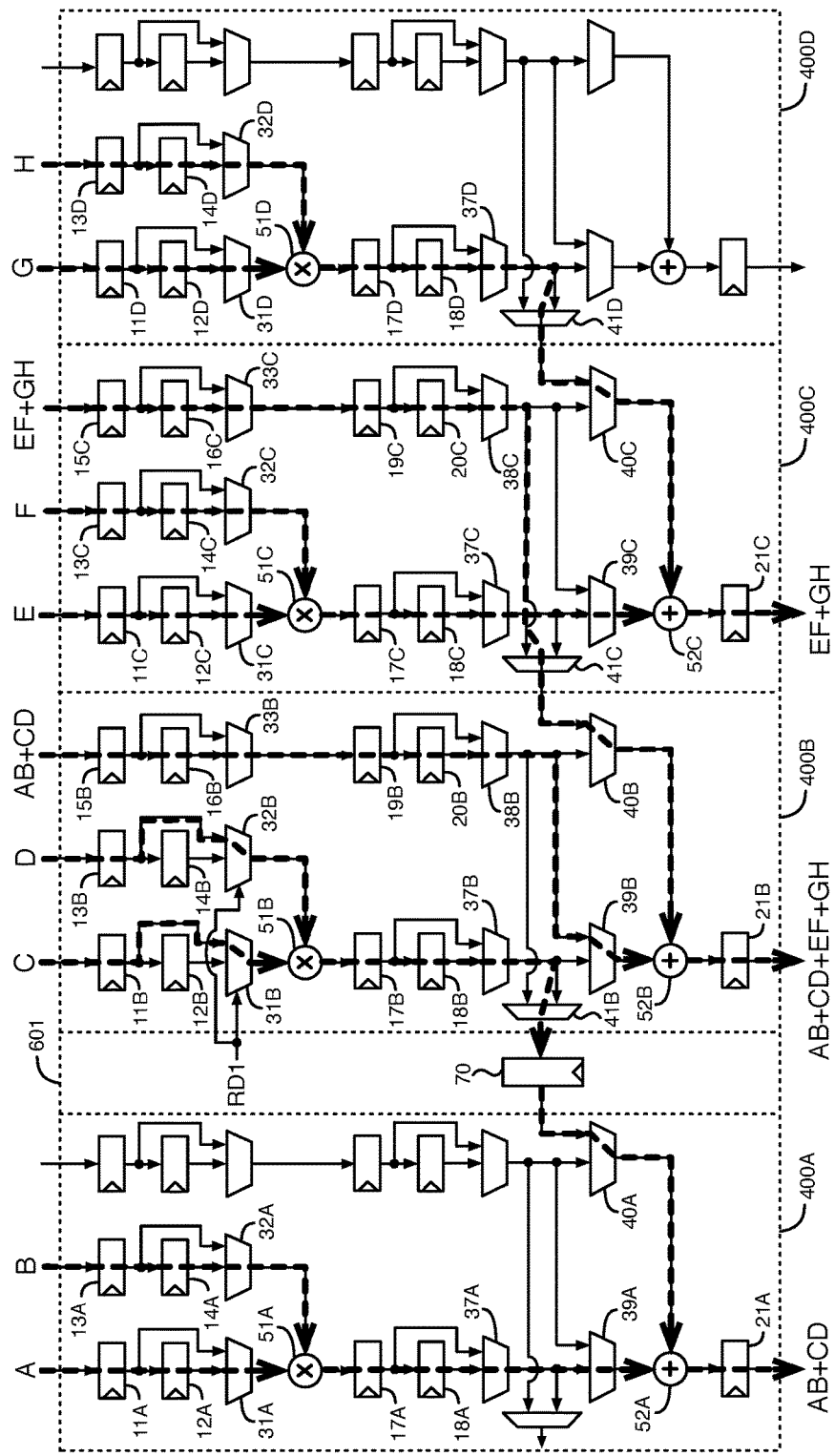
FIG. 6 illustrates another exemplary selection of data paths through DSP circuit blocks for the dot product operation of FIG. 4 that compensates for a redundant DSP circuit block between DSP circuit blocks, according to an embodiment.

FIG. 6 illustrates another exemplary selection of data paths through DSP circuit blocks 400A-400D for the dot product operation of FIG. 4 that compensates for a redundant DSP circuit block 601 between DSP circuit blocks 400A and 400B, according to an embodiment. In the embodiment of FIG. 6, DSP circuit block 601 is a redundant DSP circuit block. The redundant DSP circuit block may be, for example, in a redundant row or column of circuit blocks. DSP circuit block 601 may contain a defect, for example, in its internal logic circuitry. If DSP circuit block 601 contains a defect, the internal logic circuitry (e.g., the adder and multiplier circuits) of circuit block 601 is not used in the dot product operation.

The redundant DSP circuit block 601 includes a register circuit 70. Register circuit 70 adds an additional latency of one clock cycle into the data path that provides the output CD of multiplier circuit 51B to the second input of adder circuit 52A. Register circuit 70 may be an example of one of the register circuits 115 and 116 of FIGS. 1-2. In order to compensate for the additional latency that register circuit 70 adds in the data path of CD, the logic state of a select signal RD1 is adjusted to cause multiplexer circuits 31B and 32B to bypass register circuits 12B and 14B in the data paths of elements C and D, as shown by the dotted lines in FIG. 6. The select signal RD1 is provided to the select inputs of multiplexer circuits 31B and 32B. Select signal RD1 controls the input selections of multiplexer circuits 31B and 32B. Signal RD1 may, for example, be generated by circuitry within DSP circuit block 601.

By causing multiplexer circuits 31B and 32B to bypass register circuits 12B and 14B, the latencies of elements C and D from the inputs of registers 11B and 13B to the inputs of multiplier circuit 51B are reduced by one clock cycle that corresponds to the latency through register circuits 12B and 14B. This reduction in the latencies of elements C and D by one clock cycle compensates for the extra clock cycle latency that register circuit 70 adds into the data path of product CD from multiplier circuit 51B to adder circuit 52A, because the data paths of elements C and D are branches of the data path of product CD. Thus, multiplexer circuits 31B and 32B and register circuits 12B and 14B provide variable latency to the circuit structure of FIG. 6 that can compensate for extra latency added by a redundant circuit block, such as circuit block 601.

Figure 7:
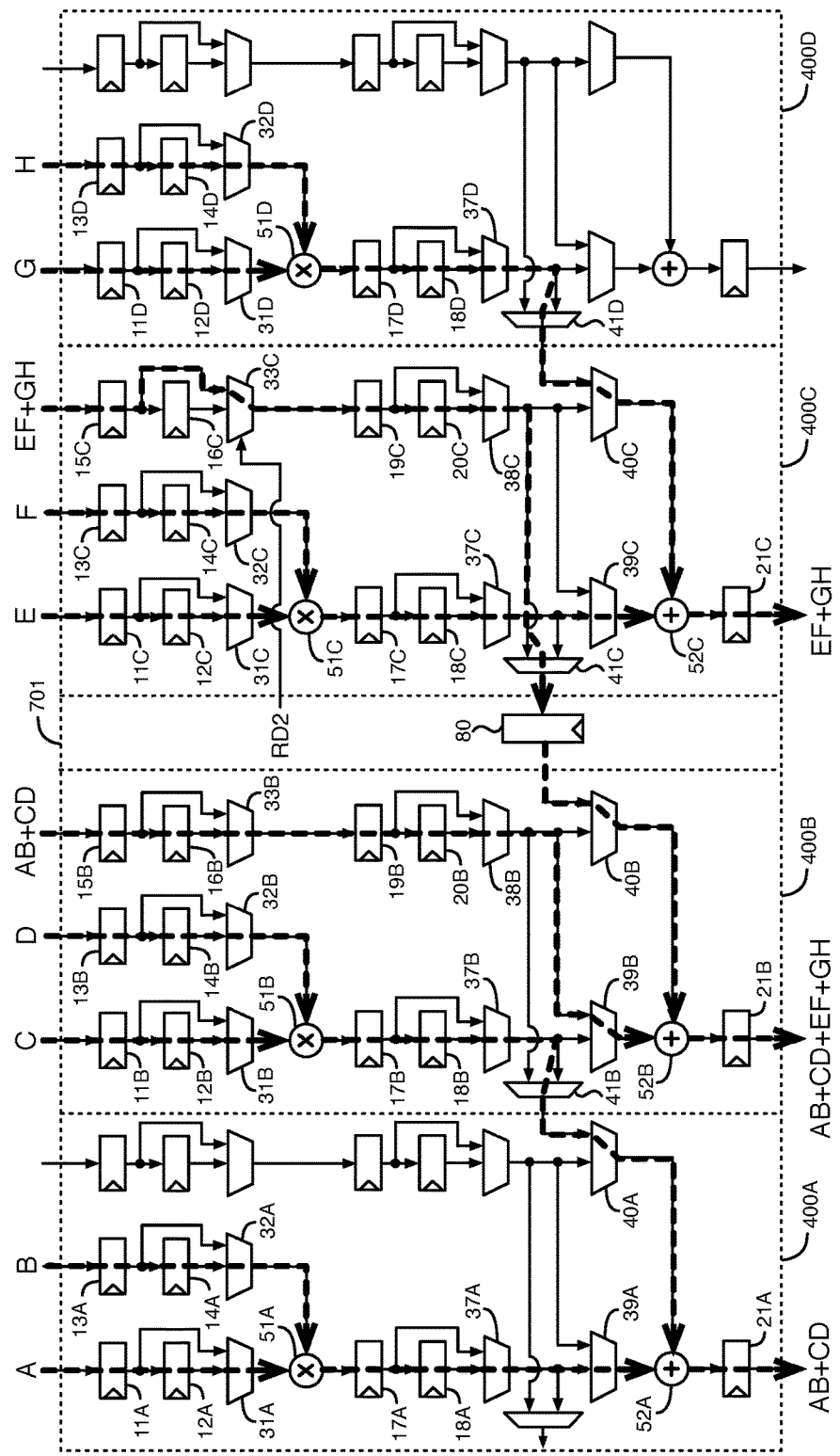
FIG. 7 illustrates yet another exemplary selection of data paths through DSP circuit blocks for the dot product operation of FIG. 4 that compensates for a redundant DSP circuit block between DSP circuit blocks, according to an embodiment.

FIG. 7 illustrates another exemplary selection of data paths through DSP circuit blocks 400A-400D for the dot product operation of FIG. 4 that compensates for a redundant DSP circuit block 701 between DSP circuit blocks 400B and 400C, according to an embodiment. In the embodiment of FIG. 7, DSP circuit block 701 is a redundant DSP circuit block that may be, for example, in a redundant row or column of circuit blocks. DSP circuit block 701 may, for example, contain a defect. If DSP circuit block 701 contains a defect, the internal logic circuitry (e.g., the adder and multiplier circuits) of circuit block 701 is not used in the dot product operation.

The redundant DSP circuit block 701 includes a register circuit 80. Register circuit 80 adds an additional latency of one clock cycle into the data path that provides the sum EF+GH to the second input of adder circuit 52B. Register circuit 80 may be an example of one of the register circuits 115 and 116 of FIGS. 1-2. In order to compensate for the additional latency that register circuit 80 adds in the data path of EF+GH, the logic state of a select signal RD2 is adjusted to cause multiplexer circuit 33C to bypass register circuit 16C in the data path of EF+GH. The select signal RD2 is provided to the select input of multiplexer circuit 33C. Select signal RD2 controls the input selection of multiplexer circuit 33C. Signal RD2 may, for example, be generated by circuitry within DSP circuit block 701.

By causing multiplexer circuit 33C to bypass register circuit 16C, the latency of sum EF+GH is reduced by one clock cycle that corresponds to the latency through register circuit 16C. This reduction in the latency of sum EF+GH by one clock cycle compensates for the extra clock cycle latency that register circuit 80 adds into the data path of sum EF+GH. As a result, the latency of sum EF+GH through the data path from register circuit 15C to adder circuit 52B is unchanged by the addition of register circuit 80 into the data path. Thus, multiplexer circuit 33C and register circuit 16C provide variable latency to the circuit structure of FIG. 7 that can compensate for extra latency added by a redundant circuit block, such as circuit block 701.

According to various embodiments disclosed herein, a variable latency redundancy system can compensate for the additional latency added by a register in a redundant circuit block. As a result, no adjustment to the system pipelining may be required if a redundant circuit block having a register (e.g., register circuit 70 or 80) is used in a data path. However, the variable latency redundancy system may add one additional clock cycle of latency to any level of a reduction tree, such as the reduction tree of FIG. 4. As an example, in a 64 element reduction tree, at least 6 additional clock cycles of latency are added compared to a standard redundancy structure.

Figure 8:
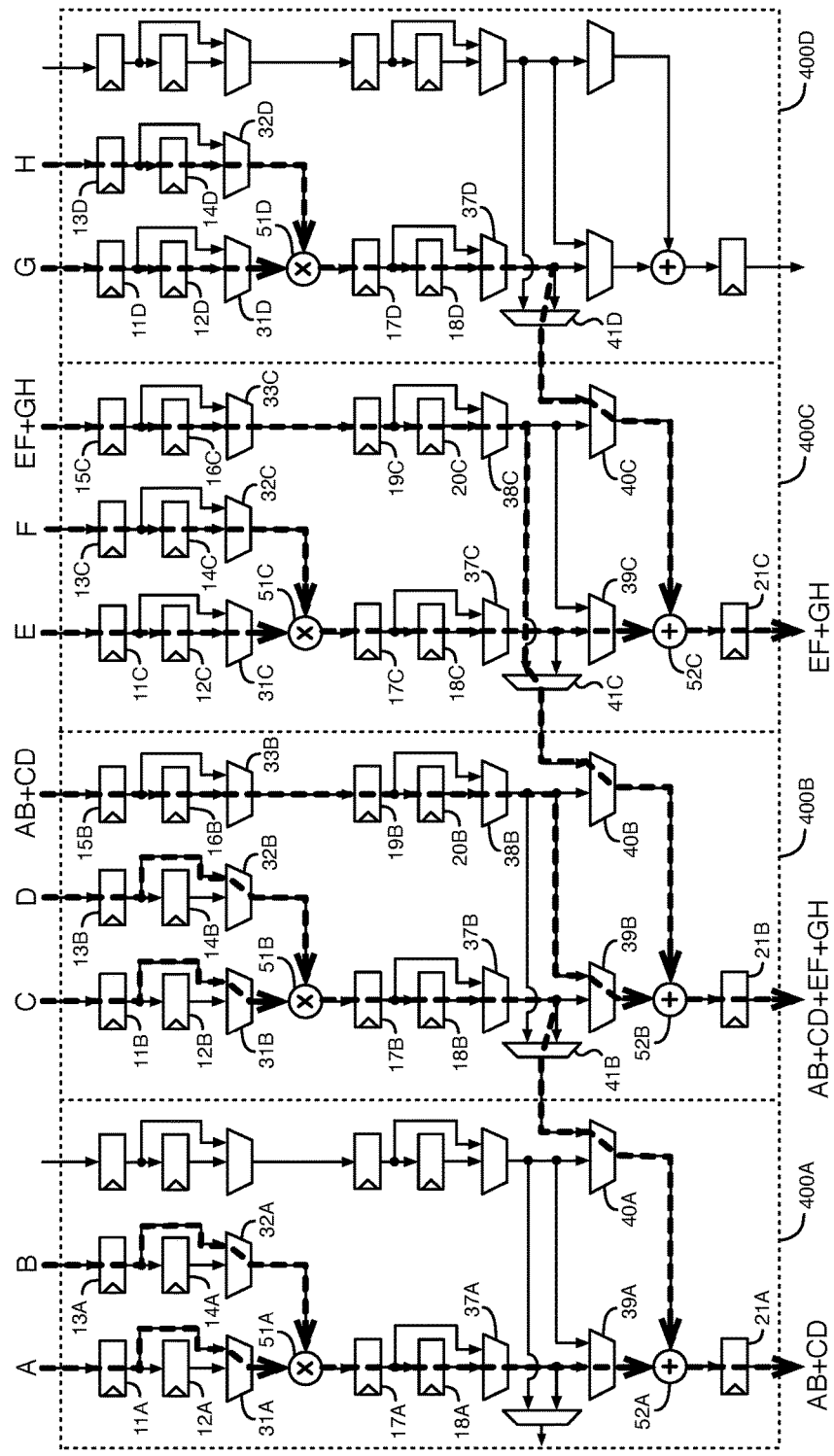
FIG. 8 illustrates another exemplary selection of data paths through DSP circuit blocks for the dot product operation of FIG. 4 in which register circuits are bypassed without redundancy, according to an embodiment.

FIG. 8 illustrates another exemplary selection of data paths through DSP circuit blocks 400A-400D for the dot product operation of FIG. 4 in which register circuits are bypassed without redundancy, according to an embodiment. In FIG. 8, no redundant DSP circuit blocks are coupled between any adjacent pair of the DSP circuit blocks 400A-400D. Two register circuits in each of DSP circuit blocks 400A and 400B are bypassed using multiplexer circuits, as described below and shown in FIG. 8.

In DSP circuit block 400A, multiplexer circuits 31A and 32A are configured to bypass register circuits 12A and 14A, respectively. As a result, elements A and B are provided through register circuits 11A and 13A and through multiplexer circuits 31A and 32A, respectively, to inputs of multiplier circuit 51A. In DSP circuit block 400B, multiplexer circuits 31B and 32B are configured to bypass register circuits 12B and 14B, respectively. As a result, elements C and D are provided through register circuits 11B and 13B and through multiplexer circuits 31B and 32B, respectively, to inputs of multiplier circuit 51B. Thus, the latency of the data path for each of elements A, B, C, and D is reduced by one clock cycle compared to the embodiment of FIG. 5.

Figure 9:
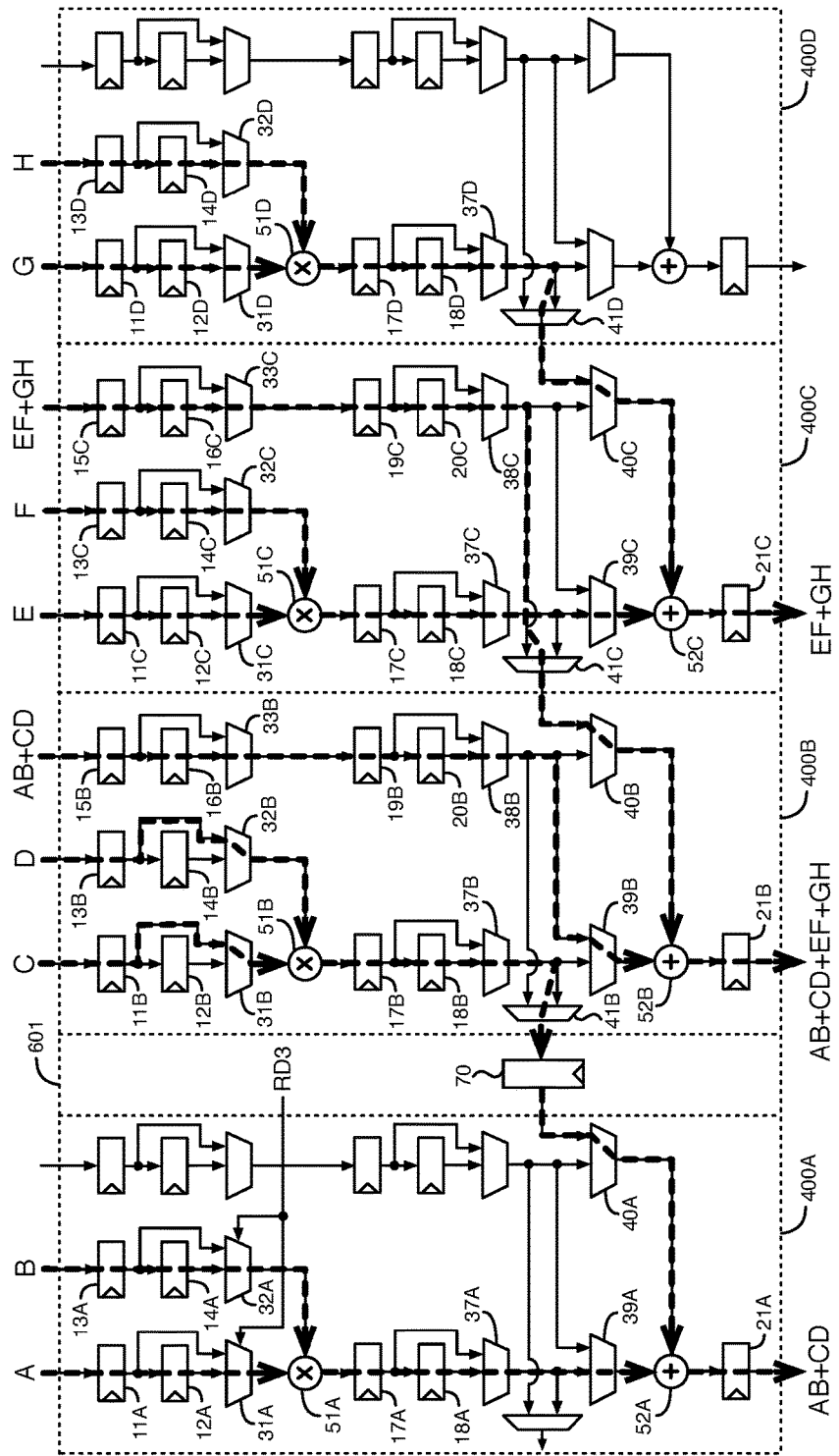
FIG. 9 illustrates another exemplary selection of data paths through DSP circuit blocks for the dot product operation of FIG. 4 in which some register circuits are not bypassed with redundancy, according to an embodiment.

FIG. 9 illustrates another exemplary selection of data paths through DSP circuit blocks 400A-400D for the dot product operation of FIG. 4 in which some register circuits are not bypassed with redundancy, according to yet another embodiment. In FIG. 9, the redundant DSP circuit block 601 is coupled between DSP circuit blocks 400A and 400B, as with the embodiment of FIG. 6. Because the redundant DSP circuit block 601 is coupled between DSP circuit blocks 400A-400B, the data paths shown in FIG. 8 for circuit block 400A are modified in FIG. 9 to add latency that compensates for the extra clock cycle latency that register circuit 70 adds to the data path of product CD.

In order to compensate for the extra clock cycle latency of register circuit 70, the logic state of a select signal RD3 is adjusted to cause multiplexer circuits 31A and 32A to couple register circuits 12A and 14A into the data paths of elements A and B. The select signal RD3 is provided to the select inputs of multiplexer circuits 31A and 32A. Select signal RD3 controls the input selections of multiplexer circuits 31A and 32A. Signal RD3 may, for example, be generated by circuitry within DSP circuit block 601.

By causing multiplexer circuits 31A and 32A to couple register circuits 12A and 14A into the data paths of elements A and B, the latencies of elements A and B are increased by one clock cycle that corresponds to the latencies through register circuits 12A and 14A. These increases in the latencies of A and B by one clock cycle compensate for the extra clock cycle latency that register circuit 70 adds into the data path of product CD generated by multiplier 51B. The data paths of elements A and B are branches of the data path of product AB. Thus, the extra clock cycle latencies that register circuits 12A and 14A add into the data paths of elements A and B cause the latency of the data path of product AB to match the latency of the data path of product CD, which includes the latencies of data path branches C and D. Thus, multiplexer circuits 31A and 32A and register circuits 12A and 14A provide variable latency to the circuit structure of FIGS. 8-9 that can compensate for extra latency added by a redundant circuit block, such as circuit block 601.

Figure 10:
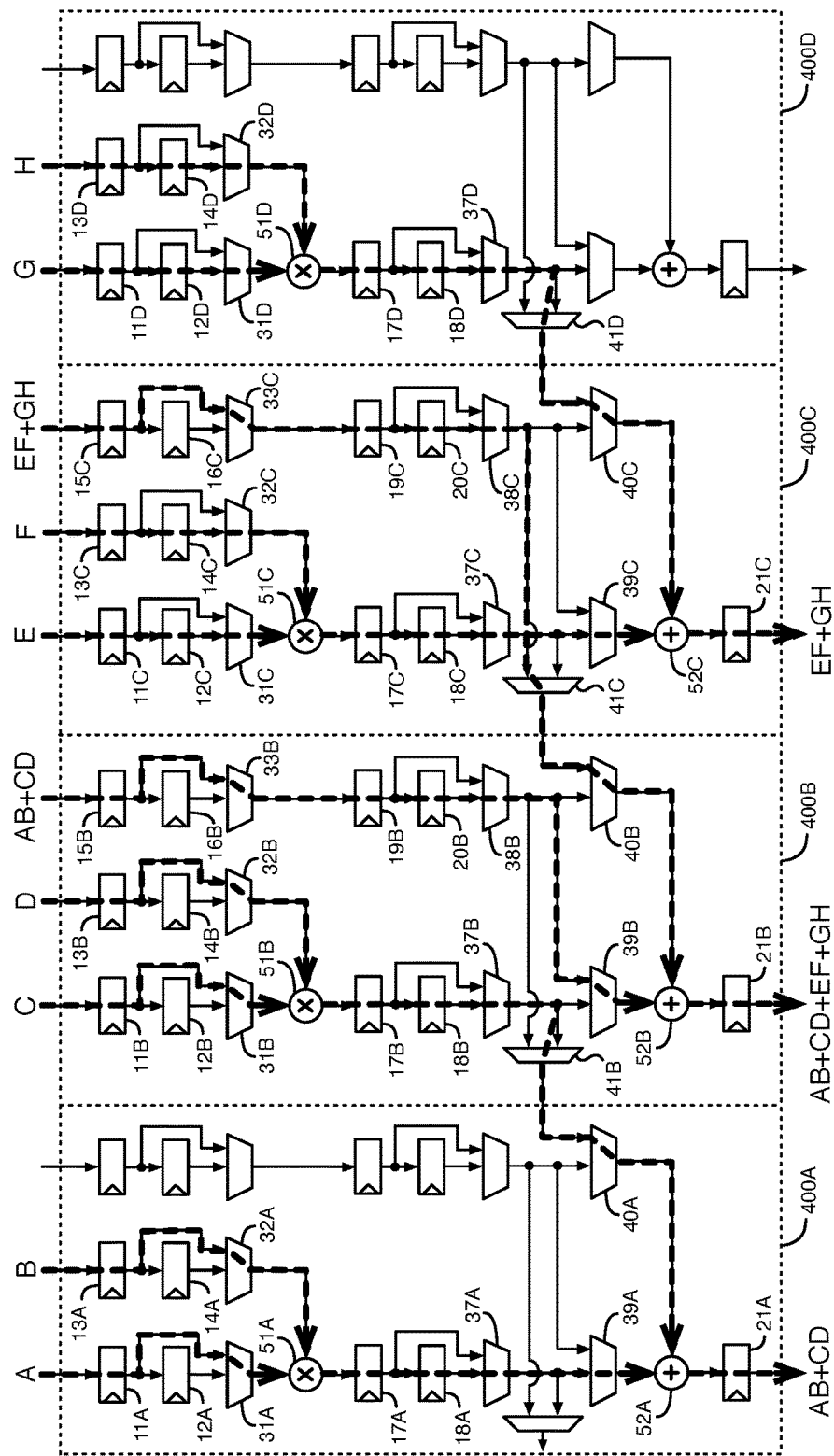
FIG. 10 illustrates another exemplary selection of data paths through DSP circuit blocks for the dot product operation of FIG. 4 in which register circuits in three of the DSP circuit blocks are bypassed without redundancy, according to an embodiment.

FIG. 10 illustrates another exemplary selection of data paths through DSP circuit blocks 400A-400D for the dot product operation of FIG. 4 in which register circuits in three of the DSP circuit blocks are bypassed without redundancy, according to yet another embodiment. In FIG. 10, no redundant DSP circuit blocks are coupled between DSP circuit blocks 400A-400D. One or more register circuits in each of DSP circuit blocks 400A, 400B, and 400C are bypassed using one or more multiplexer circuits, as described below and shown in FIG. 10.

In FIG. 10, register circuits 12A, 14A, 12B, and 14B are bypassed using multiplexer circuits 31A, 32A, 31B, and 32B to reduce the latencies of elements A, B, C, and D, respectively, as with the embodiment of FIG. 8. Also, in the embodiment of FIG. 10, multiplexer circuit 33B is configured to bypass register circuit 16B in the data path of sum AB+CD, and multiplexer circuit 33C is configured to bypass register circuit 16C in the data path of sum EF+GH. As a result, the latency of the data path of each of AB+CD and EF+GH is reduced by one clock cycle.

Figure 11:
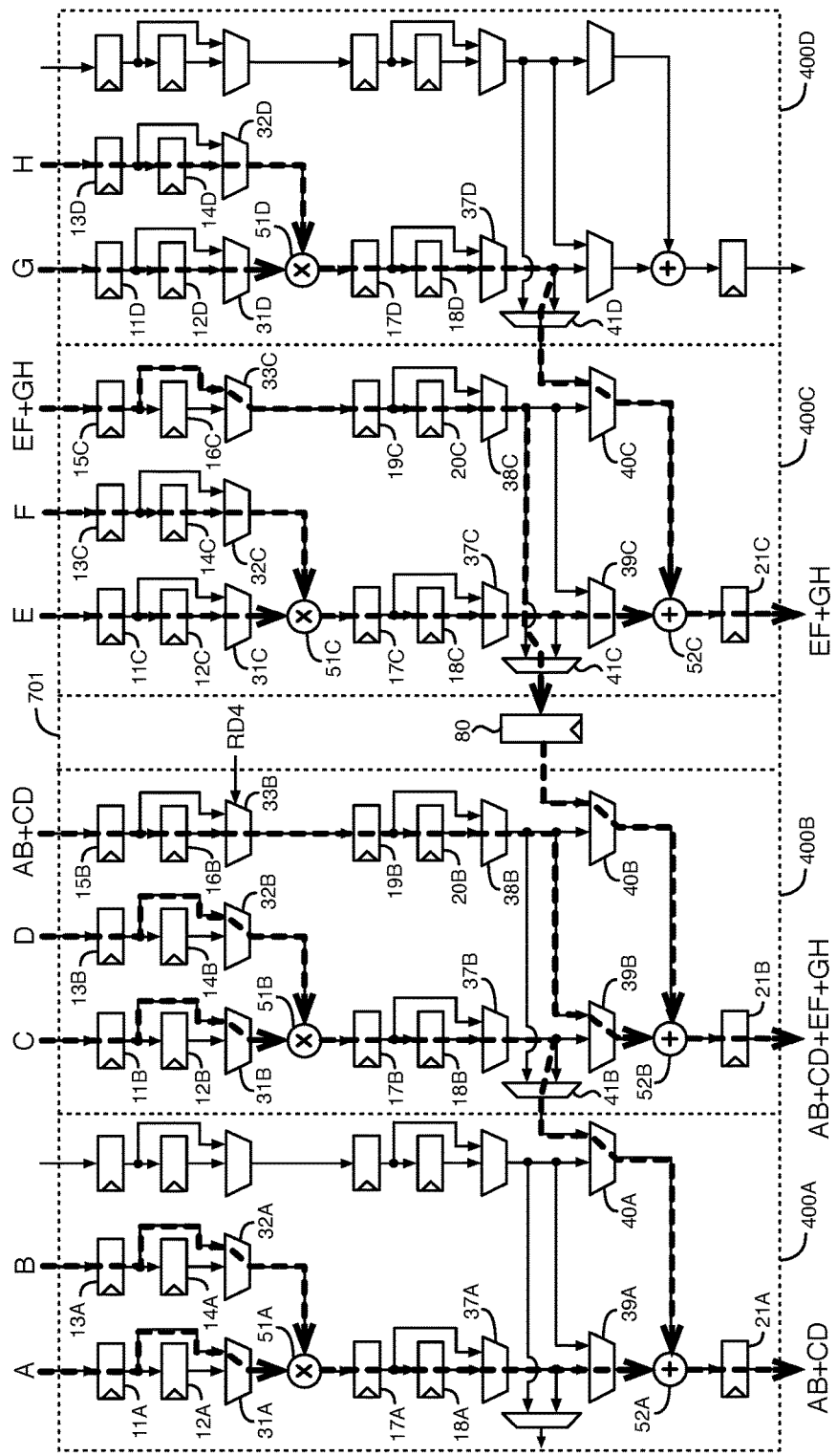
FIG. 11 illustrates another exemplary selection of data paths through DSP circuit blocks for the dot product operation of FIG. 4 in which a register circuit is not bypassed with redundancy, according to an embodiment.

FIG. 11 illustrates another exemplary selection of data paths through DSP circuit blocks 400A-400D for the dot product operation of FIG. 4 in which a register circuit is not bypassed with redundancy, according to yet another embodiment. In FIG. 11, the redundant DSP circuit block 701 is coupled between DSP circuit blocks 400B and 400C, as with the embodiment of FIG. 7. Because the redundant DSP circuit block 701 is coupled between DSP circuit blocks 400B-400C, the data path shown in FIG. 10 for sum AB+CD is modified in FIG. 11 to add latency that compensates for the extra clock cycle latency that register circuit 80 adds to the data path of sum EF+GH.

In order to compensate for the extra clock cycle latency of register circuit 80, the logic state of a select signal RD4 is adjusted to cause multiplexer circuit 33B to couple register circuit 16B into the data path of sum AB+CD. The select signal RD4 is provided to the select input of multiplexer circuit 33B. Select signal RD4 controls the input selection of multiplexer circuit 33B. Signal RD4 may, for example, be generated by circuitry within DSP circuit block 701.

By causing multiplexer circuit 33B to couple register circuit 16B into the data path of sum AB+CD, the latency of sum AB+CD is increased by one clock cycle that corresponds to the latency through register circuit 16B. This increase in the latency of AB+CD by one clock cycle compensates for the extra clock cycle latency that register circuit 80 adds into the data path of sum EF+GH. The extra clock cycle latency that register circuit 16B adds into the data path of AB+CD matches and compensates for the extra clock cycle latency that register circuit 80 adds into the data path of EF+GH. Thus, multiplexer circuit 33B and register circuit 16B provide variable latency to the circuit structure of FIGS. 10-11 that can compensate for extra latency added by a redundant circuit block, such as circuit block 701.

Figure 12:
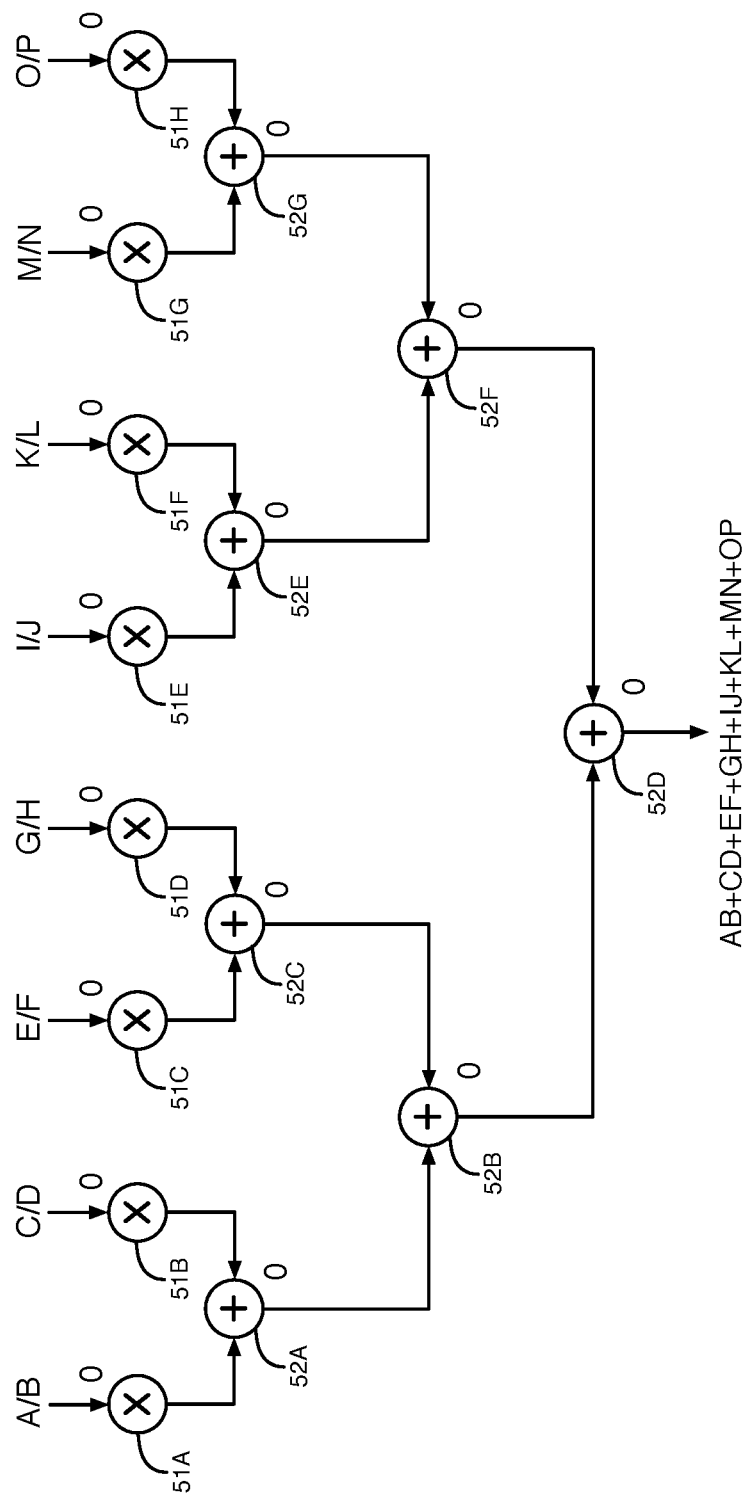
FIG. 12 is a diagram of a recursive reduction dataflow tree for a dot product operation that denotes additional pipeline delays created by the use of redundant circuit blocks, according to an embodiment.

FIG. 12 is a diagram of a recursive reduction dataflow tree for a dot product operation that denotes additional pipeline delays created by the use of redundant circuit blocks, according to an embodiment. The recursive reduction dataflow tree of FIG. 12 illustrates additional pipeline delays for a dot product operation performed on two vectors that each have 8 elements. As an example, the vectors being multiplied in the dot product operation may be X=(A, C, E, G, I, K, M, O) and Y=(B, D, F, H, J, L, N, P). The recursive reduction dataflow tree of FIG. 12 may be, for example, implemented by 8 DSP circuit blocks 400. The 8 DSP circuit blocks 400 are two sets of the DSP circuit blocks 400A-400D of FIG. 4 coupled together using the selected data paths shown in FIG. 5 for each set of the four DSP circuit blocks 400. In this embodiment, elements I, J, K, L M, N, O and P are substituted for elements A, B, C, D, E, F, G, and H, respectively, in the second set of DSP circuit blocks 400E-400H. Adder circuit 52D performs the final addition to generate the result AB+CD+EF+GH+IJ+KL+MN+OP.

FIG. 12 illustrates multiplier circuits 51A-51H and adder circuits 52A-52G. Multiplier circuits 51E-51H are in the second set of DSP circuit blocks 400E-400H, respectively. Adder circuits 52E-52G are in the first three DSP circuit blocks 400E-400G of the second set of DSP circuit blocks, respectively. The additional pipeline delay created by the use of redundant circuit blocks is 0 at each of the nodes shown in FIG. 12, because none of the selected data paths shown in FIG. 5 pass through redundant circuit blocks.

Figure 13:
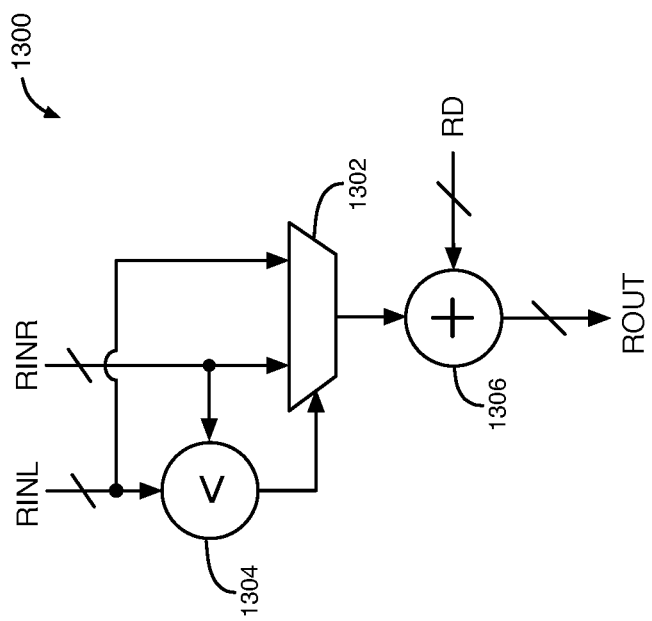
FIG. 13 illustrates an example of an adder circuit that may be used for signaling downstream of a point of redundancy to align the latencies of branches of a recursive reduction dataflow tree, according to an embodiment.

Branches in a recursive reduction dataflow tree may have different latencies, for example, as a result of increases in the latency caused by redundancy. FIG. 13 illustrates an example of a redundancy calculation circuit 1300 that may be used for signaling downstream of a point of redundancy to align the latencies of branches of a recursive reduction dataflow tree, according to an embodiment. Redundancy calculation circuit 1300 receives three input values RINL, RINR, and RD at its inputs.

RINL equals the increased latency added by any redundant circuit blocks in the branches of the data paths feeding the left input of the node represented by redundancy calculation circuit 1300. RINR equals the increased latency added by any redundant circuit blocks in the branches of the data paths feeding the right input of the node represented by redundancy calculation circuit 1300. RD equals the increased latency added by any redundant circuit blocks at the node represented by redundancy calculation circuit 1300 (e.g., one of signals RD1-RD4). Thus, RINL, RINR, and RD indicate the increased latencies caused by the use of redundancy, which indicate a relative latency rather than an absolute latency. Redundancy calculation circuit 1300 generates an output value ROUT by first selecting the larger value of RINL and RINR using comparator circuit 1304 and providing the selected value to the select input of multiplexer circuit 1302. Multiplexer circuit 1302 then provides the larger value of RINL or RINR to adder circuit 1306. Adder circuit 1306 adds the larger value of RINL or RINR to RD to generate ROUT. ROUT indicates the total latency caused by redundancy at a node. In an alternative embodiment, if only one redundant circuit block is available per device or per logic sector, then the adder circuit 1306 may be replaced with an OR gate logic circuit.

Figure 14:
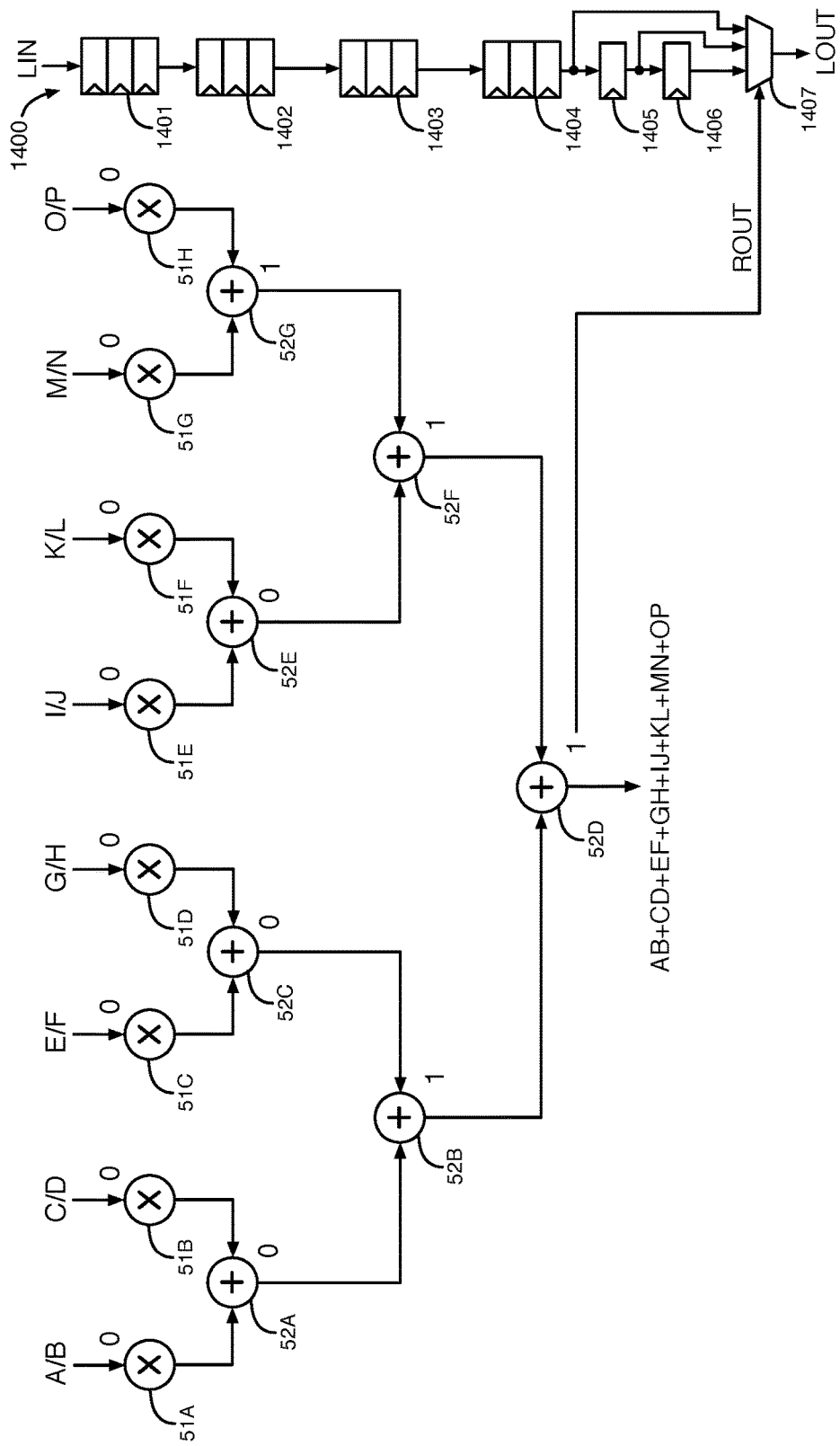
FIG. 14 is a diagram of another recursive reduction dataflow tree for a dot product operation that denotes additional pipeline delays created by the use of redundant circuit blocks, according to an embodiment.

FIG. 14 is a diagram of another recursive reduction dataflow tree for a dot product operation that denotes additional pipeline delays created by the use of redundant circuit blocks, according to an embodiment. The diagram of FIG. 14 shows how the output ROUT of redundancy calculation circuit 1300 may be used to create a correct data valid indication. An additional redundancy calculation circuit 1300 may be used to sum the latencies at each node, for example, at one or more of the adder circuits 52. In FIG. 14, one redundant DSP circuit block is used in the right side of the recursive reduction dataflow tree, and another redundant DSP circuit block is used in the left side of the recursive reduction dataflow tree. The redundancy calculation circuit 1300 at adder circuit 52D generates an output ROUT that indicates the total additional pipeline latency increased by redundancy is 1. This increased latency of 1 indicated by ROUT is used to select the overall latency LOUT of the recursive reduction dataflow tree of FIG. 14. In some embodiments, a maximum of two redundant circuit blocks or two rows of circuit blocks may be provided in the IC.

In FIG. 14, a delay chain 1400 is added in parallel with the recursive reduction dataflow tree. The delay chain 1400 includes 4 sets 1401-1404 of three register circuits. In the example of FIG. 14, there are 4 levels of the recursive reduction dataflow tree, including one level for the multiplier circuits 51. Each of the 4 sets 1401-1404 of register circuits in the delay chain 1400 corresponds to one of the 4 levels of the dataflow tree. Each of the 4 sets 1401-1404 of the register circuits provides a latency of three clock cycles to an input LIN. The latency of each of the 4 sets 1401-1404 of the register circuits equals the minimum latency (i.e., three clock cycles) of each level of the recursive reduction dataflow tree.

Two additional register circuits 1405-1406 are coupled at the end of the delay chain 1400, and a multiplexer circuit 1407 is coupled to the register circuits 1405-1406. The increased latency indication (ROUT) generated by the redundancy calculation circuit 1300 at adder circuit 52D is used to control multiplexer circuit 1407 to select the overall latency LOUT of the recursive reduction dataflow tree from either the input of one of the register circuits 1405-1406 or from the output of register circuit 1406.

Figure 15:
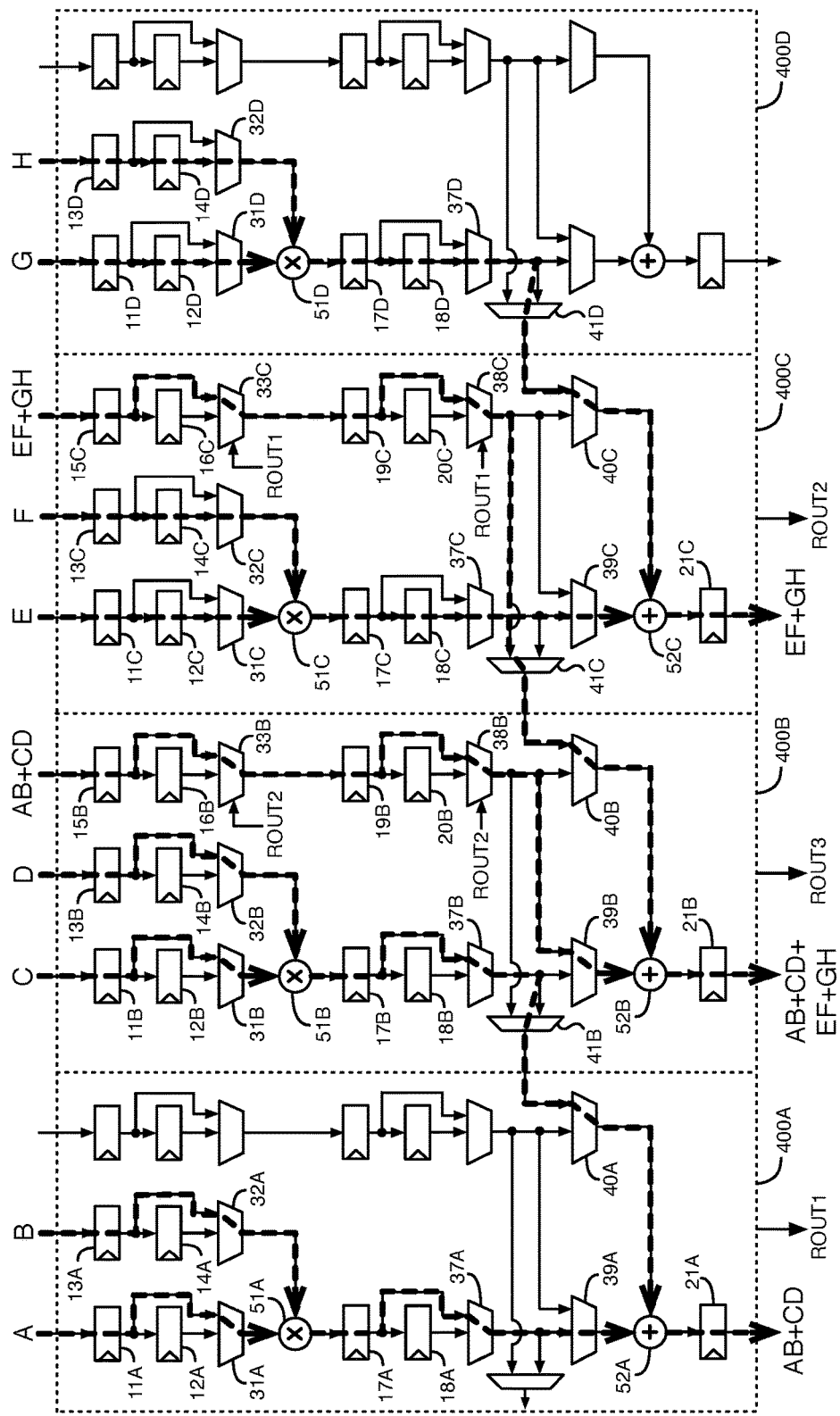
FIG. 15 illustrates another exemplary selection of data paths through DSP circuit blocks for the dot product operation of FIG. 4 in which additional register circuits in the DSP circuit blocks are bypassed without redundancy, according to yet another embodiment.

FIG. 15 illustrates another exemplary selection of data paths through DSP circuit blocks 400A-400D for the dot product operation of FIG. 4 in which additional register circuits in the DSP circuit blocks are bypassed without redundancy, according to yet another embodiment. In the embodiment of FIG. 15, no redundant DSP circuit blocks are coupled between DSP circuit blocks 400A-400D. In the embodiment of FIG. 15, multiplexer circuits 31A, 32A, 31B, and 32B are configured to bypass register circuits 12A, 14A, 12B, and 14B, respectively, multiplexer circuit 33B is configured to bypass register circuit 16B, and multiplexer circuit 33C is configured to bypass register circuit 16C, as with the embodiment of FIG. 10.

Also, in the embodiment of FIG. 15, multiplexer circuit 37A is configured to bypass register circuit 18A in the data path of product AB, multiplexer circuit 37B is configured to bypass register circuit 18B in the data path of product CD, multiplexer circuit 38B is configured to bypass register circuit 20B in the data path of AB+CD, and multiplexer circuit 38C is configured to bypass register circuit 20C in the data path of EF+GH.

The first DSP circuit block 400A generates a first output value ROUT1 that indicates the additional pipeline latency added by any redundant circuit blocks that affect the data paths of elements A, B, C, and D and products AB and CD. The third DSP circuit block 400C generates a second output value ROUT2 that indicates the additional pipeline latency added by any redundant circuit blocks that affect the data paths of elements E, F, G, and H and products EF and GH. A redundancy calculation circuit 1300 in the second DSP circuit block 400B generates a third output value ROUT3. ROUT3 indicates the total additional pipeline latency added by any redundant circuit blocks that affect any of the branches of the data path for the output value AB+CD+EF+GH that are shown in FIG. 15 through DSP circuit blocks 400A-400D. The redundancy calculation circuit 1300 in DSP circuit block 400B may add together the values ROUT1, ROUT2, and a third value that indicates the latency added by any redundant circuit blocks to the data paths of AB+CD and EF+GH to generate the output value ROUT3.

The output latency values ROUT1 and ROUT2 are provided to the opposite branches of the next level of the recursive reduction dataflow tree. The output latency values ROUT1 and ROUT2 indicate to the opposite branches of the recursive reduction dataflow tree how much to delay the data in the data paths. The output value ROUT1 is provided to the select inputs of multiplexer circuits 33C and 38C in the data path of EF+GH in DSP circuit block 400C. In the example of FIG. 15, ROUT1 configures multiplexer circuits 33C and 38C to bypass register circuits 16C and 20C, respectively. The output value ROUT2 is provided to the select inputs of multiplexer circuits 33B and 38B in the data path of AB+CD in DSP circuit block 400B. In the example of FIG. 15, ROUT2 configures multiplexer circuits 33B and 38B to bypass register circuits 16B and 20B, respectively. Thus, ROUT2 and ROUT1 have values that cause the data paths to provide the minimum latencies to AB+CD and EF+GH, respectively, because there are no redundant circuit blocks coupled into the data paths in FIG. 15.

In an exemplary embodiment, the maximum amount of redundancy in a row of DSP circuit blocks may be 2. In this embodiment, each DSP circuit block 400 adds two selectable bypass paths, and the value of each of ROUT1 and ROUT2 may be 0, 1, or 2. In FIG. 15, the default is to bypass the extra register circuits, as described above. The values ROUT1 and ROUT2 configure multiplexer circuits 33B, 33C, 38B, and 38C to bypass register circuits 16B, 16C, 20B, and 20C (as shown in FIG. 15) or to couple register circuits 16B and 16C and/or register circuits 20B and 20C into the data paths, depending on the latency added by any redundant circuit blocks in the upstream data paths. As another example, if the value of each of ROUT1 and ROUT2 equals 1 to indicate one redundant circuit block in each of the upstream data paths, then multiplexer circuits 33B, 33C, 38B, and 38C may be configured to bypass register circuits 16B and 16C and to couple register circuits 20B and 20C into the data paths.

Figure 16:
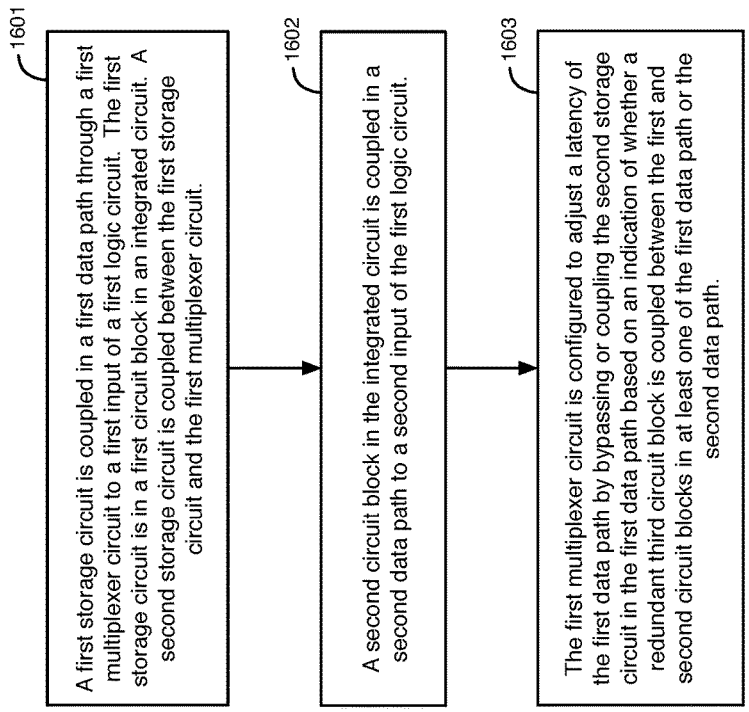
FIG. 16 is a flow chart that illustrates examples of operations for implementing a variable latency redundancy system, according to an embodiment.

FIG. 16 is a flow chart that illustrates examples of operations for implementing a variable latency redundancy system, according to an embodiment. In operation 1601, a first storage circuit is coupled in a first data path through a first multiplexer circuit to a first input of a first logic circuit. The first storage circuit is in a first circuit block in an integrated circuit. A second storage circuit is coupled between the first storage circuit and the first multiplexer circuit. In operation 1602, a second circuit block in the integrated circuit is coupled in a second data path to a second input of the first logic circuit. In operation 1603, the first multiplexer circuit is configured to adjust a latency of the first data path by bypassing or coupling the second storage circuit in the first data path based on an indication of whether a redundant third circuit block is coupled between the first and second circuit blocks in at least one of the first data path or the second data path.

The embodiments disclosed herein may be incorporated into any suitable integrated circuit. For example, the embodiments may be incorporated into numerous types of devices such as programmable logic integrated circuits, application specific standard products (ASSPs), and application specific integrated circuits (ASICs). Examples of programmable logic integrated circuits include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic integrated circuits described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic integrated circuits can be used to perform a variety of different logic functions. For example, a programmable logic integrated circuit can be configured as a processor or controller that works in cooperation with a system processor. The programmable logic integrated circuit may also be used as an arbiter for arbitrating access to a shared resource in the data processing system. In yet another example, the programmable logic integrated circuit can be configured as an interface between a processor and one of the other components in the system.

Although the method operations were described in a specific order, it should be understood that other operations may be performed in between described operations, described operations may be adjusted so that they occur at slightly different times or in a different order, or described operations may be distributed in a system that allows the occurrence of the operations at various intervals associated with the processing.

The following examples pertain to further embodiments. Example 1 is an integrated circuit comprising: a first circuit block comprising a first storage circuit, wherein a first data path passes through the first storage circuit and a first multiplexer circuit to a first input of a first logic circuit, wherein the first multiplexer circuit is coupled to an output of the first storage circuit, and wherein a second storage circuit is coupled between the first storage circuit and the first multiplexer circuit; and a second circuit block, wherein a second data path passes through the second circuit block to a second input of the first logic circuit, and wherein the first multiplexer circuit is configurable to bypass the second storage circuit in the first data path or to couple the second storage circuit into the first data path based on an indication of whether a redundant third circuit block is coupled between the first and second circuit blocks in at least one of the first data path or the second data path.

In Example 2, the subject matter of Example 1 can optionally include wherein the first circuit block further comprises a second logic circuit that generates first data in the first data path and second data in the second data path, wherein the second circuit block comprises the first logic circuit, and wherein the first logic circuit performs a logic function using the first data received from the first data path and the second data received from the second data path.

In Example 3, the subject matter of Example 1 can optionally include wherein the first logic circuit is an arithmetic circuit in the first circuit block that performs an arithmetic function on data received from the first and second data paths, and wherein the first multiplexer circuit is configurable to bypass the second storage circuit in the first data path or to couple the second storage circuit into the first data path based on the indication of whether the redundant third circuit block is coupled between the first and second circuit blocks in the second data path.

In Example 4, the subject matter of any one of Examples 1-2 can optionally include wherein the first logic circuit is an arithmetic circuit in the second circuit block that performs an arithmetic function on data received from the first and second data paths, and wherein the first multiplexer circuit is configurable to bypass the second storage circuit in the first data path or to couple the second storage circuit into the first data path based on the indication of whether the redundant third circuit block is coupled between the first and second circuit blocks in the first data path.

In Example 5, the subject matter of any one of Examples 1-4 can optionally include wherein the first circuit block further comprises third and fourth storage circuits coupled in series and a second multiplexer circuit coupled to outputs of the third and fourth storage circuits, wherein the first data path passes through the third storage circuit and the second multiplexer circuit to the first input of the first logic circuit, and wherein the second multiplexer circuit is configurable to bypass the fourth storage circuit in the first data path or to couple the fourth storage circuit into the first data path based on the indication of whether the redundant third circuit block is coupled between the first and second circuit blocks in at least one of the first or second data paths.

In Example 6, the subject matter of Example 5 can optionally include wherein a first branch of the first data path passes through the third storage circuit and the second multiplexer circuit to a first input of a second logic circuit in the first circuit block, wherein a second branch of the first data path passes through the first storage circuit and the first multiplexer circuit to a second input of the second logic circuit, wherein the first data path passes from an output of the second logic circuit to the first input of the first logic circuit, and wherein the first and second branches of the first data path are coupled in parallel.

In Example 7, the subject matter of Example 5 can optionally include wherein the first data path further comprises a second logic circuit, and wherein the first data path passes from an output of the second logic circuit through the third storage circuit and the second multiplexer circuit to the first input of the first logic circuit.

In Example 8, the subject matter of any one of Examples 1 or 3 can optionally include a fourth circuit block that comprises third and fourth storage circuits coupled in series and a second multiplexer circuit coupled to outputs of the third and fourth storage circuits, wherein a third data path passes through the third storage circuit and the second multiplexer circuit to a first input of a second logic circuit in the second circuit block, and wherein the second multiplexer circuit is configurable to bypass the fourth storage circuit in the third data path or to couple the fourth storage circuit into the third data path based on an indication of whether a fifth storage circuit in a redundant fifth circuit block is coupled between the second and fourth circuit blocks in the third data path.

In Example 9, the subject matter of Example 8 can optionally include wherein the second circuit block further comprises sixth and seventh storage circuits coupled in series and a third multiplexer circuit coupled to outputs of the sixth and seventh storage circuits, wherein a fourth data path passes through the sixth storage circuit and the third multiplexer circuit to a second input of the second logic circuit, and wherein the third multiplexer circuit is configurable to bypass the seventh storage circuit in the fourth data path or to couple the seventh storage circuit into the fourth data path based on an indication of whether the fifth storage circuit in the redundant fifth circuit block is coupled between the second and fourth circuit blocks in the third data path.

In Example 10, the subject matter of any one of Examples 1 or 3 can optionally include wherein the second circuit block comprises third and fourth storage circuits coupled in series and a second multiplexer circuit coupled to outputs of the third and fourth storage circuits, wherein the second data path passes through the second multiplexer circuit and the third storage circuit, and wherein the second multiplexer circuit is configurable to bypass the fourth storage circuit in the second data path or to couple the fourth storage circuit into the second data path based on the indication of whether the redundant third circuit block is coupled between the first and second circuit blocks in at least one of the first or second data paths.

In Example 11, the subject matter of Example 10 can optionally include wherein the second circuit block further comprises fifth and sixth storage circuits coupled in series and a third multiplexer circuit coupled to outputs of the fifth and sixth storage circuits, wherein a first branch of the second data path passes through the fifth storage circuit and the third multiplexer circuit to a first input of a second logic circuit in the second circuit block, wherein a second branch of the second data path passes through the second multiplexer circuit and the third storage circuit to a second input of the second logic circuit, wherein the second data path passes from an output of the second logic circuit to the second input of the first logic circuit, and wherein the first and second branches are coupled in parallel.

In Example 12, the subject matter of Example 11 can optionally include wherein the third multiplexer circuit is configurable to bypass the sixth storage circuit in the first branch of the second data path or to couple the sixth storage circuit into the first branch of the second data path based on the indication of whether the redundant third circuit block is coupled between the first and second circuit blocks in at least one of the first or second data paths.

In Example 13, the subject matter of any one of Examples 1-12 can optionally include wherein the first circuit block further comprises a redundancy calculation circuit that generates an output indicative of an additional pipeline latency added by any redundant circuit blocks in the first and second data paths by adding the greater of a first latency caused by any redundant circuit blocks in the first data path or a second latency caused by any redundant circuit blocks in the second data path to a third latency caused by any redundant circuit blocks at the first logic circuit.

Example 14 is a method for providing variable latency redundancy, the method comprising: coupling a first storage circuit in a first data path through a first multiplexer circuit to a first input of a first logic circuit, wherein the first storage circuit is in a first circuit block in an integrated circuit, and wherein a second storage circuit is coupled between the first storage circuit and the first multiplexer circuit; coupling a second circuit block in the integrated circuit in a second data path to a second input of the first logic circuit; and configuring the first multiplexer circuit to adjust a latency of the first data path by bypassing or coupling the second storage circuit in the first data path based on an indication of whether a redundant third circuit block is coupled between the first and second circuit blocks in at least one of the first data path or the second data path.

In Example 15, the subject matter of Example 14 can optionally include wherein coupling the second circuit block in the second data path further comprises: coupling a third storage circuit in the second data path through a second multiplexer circuit to the second input of the first logic circuit, and wherein the second multiplexer circuit, the third storage circuit, and a fourth storage circuit are in the second circuit block; and configuring the second multiplexer circuit to adjust a latency of the second data path by bypassing or coupling the fourth storage circuit in the second data path based on the indication of whether the redundant third circuit block is coupled between the first and second circuit blocks in at least one of the first or second data paths.

In Example 16, the subject matter of any one of Examples 14-15 can optionally include wherein configuring the first multiplexer circuit further comprises configuring the first multiplexer circuit to adjust the latency of the first data path by bypassing or coupling the second storage circuit in the first data path based on the indication of whether the redundant third circuit block is coupled between the first and second circuit blocks in the second data path, and wherein the first logic circuit is in the first circuit block.

In Example 17, the subject matter of any one of Examples 14-15 can optionally include wherein configuring the first multiplexer circuit further comprises configuring the first multiplexer circuit to adjust the latency of the first data path by bypassing or coupling the second storage circuit in the first data path based on the indication of whether the redundant third circuit block is coupled between the first and second circuit blocks in the first data path, and wherein the first logic circuit is in the second circuit block.

In Example 18, the subject matter of Example 14 can optionally further comprise: coupling a third storage circuit in the first data path through a second multiplexer circuit, wherein the first circuit block further comprises the third storage circuit, a fourth storage circuit, and the second multiplexer circuit; and configuring the second multiplexer circuit to adjust the latency of the first data path by bypassing or coupling the fourth storage circuit in the first data path based on the indication of whether the redundant third circuit block is coupled between the first and second circuit blocks in at least one of the first or second data paths.

In Example 19, the subject matter of Example 18 can optionally include wherein a first branch of the first data path passes through the third storage circuit and the second multiplexer circuit to a first input of a second logic circuit in the first circuit block, wherein a second branch of the first data path passes through the first storage circuit and the first multiplexer circuit to a second input of the second logic circuit, wherein the first data path passes from an output of the second logic circuit to the first input of the first logic circuit, and wherein the first and second branches are coupled in parallel.

In Example 20, the subject matter of Example 14 can optionally further comprise: coupling a third storage circuit in a third data path through a second multiplexer circuit to a second logic circuit in the second circuit block, wherein a fourth circuit block comprises the third storage circuit, a fourth storage circuit, and the second multiplexer circuit; and configuring the second multiplexer circuit to adjust a latency of the third data path by bypassing or coupling the fourth storage circuit in the third data path based on an indication of whether a fifth storage circuit in a redundant fifth circuit block is coupled between the second and fourth circuit blocks in the third data path.

Example 21 is an integrated circuit comprising: a first means for processing data comprising a first storage circuit, wherein a first data path passes through the first storage circuit and a first multiplexer circuit to a first input of a first logic circuit, wherein the first multiplexer circuit is coupled to an output of the first storage circuit, and wherein a second storage circuit is coupled to the output of the first storage circuit and to an input of the first multiplexer circuit; and a second means for processing data, wherein a second data path passes through the second means for processing data to a second input of the first logic circuit, and wherein the first multiplexer circuit is configurable to bypass or to couple the second storage circuit in the first data path based on an indication of whether a redundant third means for processing data is coupled between the first and second means for processing data in at least one of the first or second data paths.

In Example 22, the subject matter of Example 21 can optionally include wherein the second means for processing data comprises third and fourth storage circuits and a second multiplexer circuit coupled to the third and fourth storage circuits, wherein the second data path passes through the second multiplexer circuit and the third storage circuit, and wherein the second multiplexer circuit is configurable to bypass or to couple the fourth storage circuit in the second data path based on the indication of whether the redundant third means for processing data is coupled between the first and second means for processing data in at least one of the first or second data paths.

In Example 23, the subject matter of Example 21 can optionally include wherein the first means for processing data further comprises third and fourth storage circuits coupled in series and a second multiplexer circuit coupled to outputs of the third and fourth storage circuits, wherein the first data path passes through the third storage circuit and the second multiplexer circuit to the first input of the first logic circuit, and wherein the second multiplexer circuit is configurable to bypass or to couple the fourth storage circuit in the first data path based on the indication of whether the redundant third means for processing data is coupled between the first and second means for processing data in at least one of the first or second data paths.

In Example 24, the subject matter of Example 21 can optionally further comprise: a fourth means for processing data that comprises third and fourth storage circuits coupled in series and a second multiplexer circuit coupled to outputs of the third and fourth storage circuits, wherein a third data path passes through the third storage circuit and the second multiplexer circuit to an input of a second logic circuit in the second means for processing data, and wherein the second multiplexer circuit is configurable to bypass or to couple the fourth storage circuit in the third data path based on an indication of whether a fifth storage circuit in a redundant fifth means for processing data is coupled between the second and fourth means for processing data in the third data path.

Example 25 is a computer-readable non-transitory medium storing executable instructions for providing variable latency redundancy to circuit blocks in an integrated circuit, the executable instructions comprising: instructions executable by a first circuit block to couple a first storage circuit in a first data path to a first input of a first logic circuit, wherein the first multiplexer circuit is coupled to an output of the first storage circuit, wherein a second storage circuit is coupled to the output of the first storage circuit and to an input of the first multiplexer circuit, and wherein the first storage circuit is in the first circuit block; instructions executable by a second circuit block to couple the second circuit block in a second data path to a second input of the first logic circuit; and instructions executable by the first multiplexer circuit to adjust a latency of the first data path by bypassing or coupling the second storage circuit in the first data path based on an indication of whether a redundant third circuit block is coupled between the first and second circuit blocks in at least one of the first or second data paths.

In Example 26, the subject matter of Example 25 can optionally further comprise: instructions executable by the second circuit block to couple a third storage circuit in the second data path through a second multiplexer circuit, wherein the second multiplexer circuit, the third storage circuit, and a fourth storage circuit are in the second circuit block, and wherein the third and fourth storage circuits are coupled in series and to inputs of the second multiplexer circuit; and instructions executable by the second multiplexer circuit to adjust a latency of the second data path by bypassing or coupling the fourth storage circuit in the second data path based on the indication of whether the redundant third circuit block is coupled between the first and second circuit blocks in at least one of the first or second data paths.

In Example 27, the subject matter of Example 25 can optionally further comprise: instructions executable by the first circuit block to couple a third storage circuit in the first data path through a second multiplexer circuit, wherein the first circuit block further comprises the third storage circuit, a fourth storage circuit, and the second multiplexer circuit; and instructions executable by the second multiplexer circuit to adjust the latency of the first data path by bypassing or coupling the fourth storage circuit in the first data path based on the indication of whether the redundant third circuit block is coupled between the first and second circuit blocks at least one of the first or second data paths.

In Example 28, the subject matter of Example 25 can optionally further comprise: instructions executable by a fourth circuit block to couple a third storage circuit in a third data path through a second multiplexer circuit to a second logic circuit in the second circuit block, wherein the fourth circuit block comprises the third storage circuit, a fourth storage circuit, and the second multiplexer circuit; and instructions executable by the second multiplexer circuit to adjust a latency of the third data path by bypassing or coupling the fourth storage circuit in the third data path based on an indication of whether a fifth storage circuit in a redundant fifth circuit block is coupled between the second and fourth circuit blocks in the third data path.

The foregoing description of the exemplary embodiments of the present invention has been presented for the purpose of illustration. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. An integrated circuit comprising:
   a first circuit block comprising a first storage circuit, wherein a first data path passes through the first storage circuit and a first multiplexer circuit to a first input of a first logic circuit, wherein the first multiplexer circuit is coupled to an output of the first storage circuit, and wherein a second storage circuit is coupled between the first storage circuit and the first multiplexer circuit; and
   a second circuit block, wherein a second data path passes through the second circuit block to a second input of the first logic circuit, and wherein the first multiplexer circuit is configurable to bypass the second storage circuit in the first data path or to couple the second storage circuit into the first data path based on an indication of whether a redundant third circuit block is coupled between the first and second circuit blocks in at least one of the first data path or the second data path.

2. The integrated circuit of claim 1, wherein the first circuit block further comprises a second logic circuit that generates first data in the first data path and second data in the second data path, wherein the second circuit block comprises the first logic circuit, and wherein the first logic circuit performs a logic function using the first data received from the first data path and the second data received from the second data path.

3. The integrated circuit of claim 1, wherein the first logic circuit is an arithmetic circuit in the first circuit block that performs an arithmetic function on data received from the first and second data paths, and wherein the first multiplexer circuit is configurable to bypass the second storage circuit in the first data path or to couple the second storage circuit into the first data path based on the indication of whether the redundant third circuit block is coupled between the first and second circuit blocks in the second data path.

4. The integrated circuit of claim 1, wherein the first logic circuit is an arithmetic circuit in the second circuit block that performs an arithmetic function on data received from the first and second data paths, and wherein the first multiplexer circuit is configurable to bypass the second storage circuit in the first data path or to couple the second storage circuit into the first data path based on the indication of whether the redundant third circuit block is coupled between the first and second circuit blocks in the first data path.

5. The integrated circuit of claim 1, wherein the first circuit block further comprises third and fourth storage circuits coupled in series and a second multiplexer circuit coupled to outputs of the third and fourth storage circuits, wherein the first data path passes through the third storage circuit and the second multiplexer circuit to the first input of the first logic circuit, and wherein the second multiplexer circuit is configurable to bypass the fourth storage circuit in the first data path or to couple the fourth storage circuit into the first data path based on the indication of whether the redundant third circuit block is coupled between the first and second circuit blocks in at least one of the first or second data paths.

6. The integrated circuit of claim 5, wherein a first branch of the first data path passes through the third storage circuit and the second multiplexer circuit to a first input of a second logic circuit in the first circuit block, wherein a second branch of the first data path passes through the first storage circuit and the first multiplexer circuit to a second input of the second logic circuit, wherein the first data path passes from an output of the second logic circuit to the first input of the first logic circuit, and wherein the first and second branches of the first data path are coupled in parallel.

7. The integrated circuit of claim 5, wherein the first data path further comprises a second logic circuit, and wherein the first data path passes from an output of the second logic circuit through the third storage circuit and the second multiplexer circuit to the first input of the first logic circuit.

8. The integrated circuit of claim 1 further comprising:
   a fourth circuit block that comprises third and fourth storage circuits coupled in series and a second multiplexer circuit coupled to outputs of the third and fourth storage circuits, wherein a third data path passes through the third storage circuit and the second multiplexer circuit to a first input of a second logic circuit in the second circuit block, and wherein the second multiplexer circuit is configurable to bypass the fourth storage circuit in the third data path or to couple the fourth storage circuit into the third data path based on an indication of whether a fifth storage circuit in a redundant fifth circuit block is coupled between the second and fourth circuit blocks in the third data path.

9. The integrated circuit of claim 8, wherein the second circuit block further comprises sixth and seventh storage circuits coupled in series and a third multiplexer circuit coupled to outputs of the sixth and seventh storage circuits, wherein a fourth data path passes through the sixth storage circuit and the third multiplexer circuit to a second input of the second logic circuit, and wherein the third multiplexer circuit is configurable to bypass the seventh storage circuit in the fourth data path or to couple the seventh storage circuit into the fourth data path based on an indication of whether the fifth storage circuit in the redundant fifth circuit block is coupled between the second and fourth circuit blocks in the third data path.

10. The integrated circuit of claim 1, wherein the second circuit block comprises third and fourth storage circuits coupled in series and a second multiplexer circuit coupled to outputs of the third and fourth storage circuits, wherein the second data path passes through the second multiplexer circuit and the third storage circuit, and wherein the second multiplexer circuit is configurable to bypass the fourth storage circuit in the second data path or to couple the fourth storage circuit into the second data path based on the indication of whether the redundant third circuit block is coupled between the first and second circuit blocks in at least one of the first or second data paths.

11. The integrated circuit of claim 10, wherein the second circuit block further comprises fifth and sixth storage circuits coupled in series and a third multiplexer circuit coupled to outputs of the fifth and sixth storage circuits, wherein a first branch of the second data path passes through the fifth storage circuit and the third multiplexer circuit to a first input of a second logic circuit in the second circuit block, wherein a second branch of the second data path passes through the second multiplexer circuit and the third storage circuit to a second input of the second logic circuit, wherein the second data path passes from an output of the second logic circuit to the second input of the first logic circuit, and wherein the first and second branches are coupled in parallel.

12. The integrated circuit of claim 11, wherein the third multiplexer circuit is configurable to bypass the sixth storage circuit in the first branch of the second data path or to couple the sixth storage circuit into the first branch of the second data path based on the indication of whether the redundant third circuit block is coupled between the first and second circuit blocks in at least one of the first or second data paths.

13. The integrated circuit of claim 1, wherein the first circuit block further comprises a redundancy calculation circuit that generates an output indicative of an additional pipeline latency added by any redundant circuit blocks in the first and second data paths by adding the greater of a first latency caused by any redundant circuit blocks in the first data path or a second latency caused by any redundant circuit blocks in the second data path to a third latency caused by any redundant circuit blocks at the first logic circuit.

14. A method for providing variable latency redundancy, the method comprising:
coupling a first storage circuit in a first data path through a first multiplexer circuit to a first input of a first logic circuit, wherein the first storage circuit is in a first circuit block in an integrated circuit, and wherein a second storage circuit is coupled between the first storage circuit and the first multiplexer circuit;
coupling a second circuit block in the integrated circuit in a second data path to a second input of the first logic circuit; and
configuring the first multiplexer circuit to adjust a latency of the first data path by bypassing or coupling the second storage circuit in the first data path based on an indication of whether a redundant third circuit block is coupled between the first and second circuit blocks in at least one of the first data path or the second data path.

15. The method of claim 14, wherein coupling the second circuit block in the second data path further comprises:
coupling a third storage circuit in the second data path through a second multiplexer circuit to the second input of the first logic circuit, and wherein the second multiplexer circuit, the third storage circuit, and a fourth storage circuit are in the second circuit block; and
configuring the second multiplexer circuit to adjust a latency of the second data path by bypassing or coupling the fourth storage circuit in the second data path based on the indication of whether the redundant third circuit block is coupled between the first and second circuit blocks in at least one of the first or second data paths.

16. The method of claim 14, wherein configuring the first multiplexer circuit further comprises configuring the first multiplexer circuit to adjust the latency of the first data path by bypassing or coupling the second storage circuit in the first data path based on the indication of whether the redundant third circuit block is coupled between the first and second circuit blocks in the second data path, and wherein the first logic circuit is in the first circuit block.

17. The method of claim 14, wherein configuring the first multiplexer circuit further comprises configuring the first multiplexer circuit to adjust the latency of the first data path by bypassing or coupling the second storage circuit in the first data path based on the indication of whether the redundant third circuit block is coupled between the first and second circuit blocks in the first data path, and wherein the first logic circuit is in the second circuit block.

18. The method of claim 14 further comprising:
coupling a third storage circuit in the first data path through a second multiplexer circuit, wherein the first circuit block further comprises the third storage circuit, a fourth storage circuit, and the second multiplexer circuit; and
configuring the second multiplexer circuit to adjust the latency of the first data path by bypassing or coupling the fourth storage circuit in the first data path based on the indication of whether the redundant third circuit block is coupled between the first and second circuit blocks in at least one of the first or second data paths.

19. The method of claim 18, wherein a first branch of the first data path passes through the third storage circuit and the second multiplexer circuit to a first input of a second logic circuit in the first circuit block, wherein a second branch of the first data path passes through the first storage circuit and the first multiplexer circuit to a second input of the second logic circuit, wherein the first data path passes from an output of the second logic circuit to the first input of the first logic circuit, and wherein the first and second branches are coupled in parallel.

20. A computer-readable non-transitory medium storing executable instructions for providing variable latency redundancy to circuit blocks in an integrated circuit, the executable instructions comprising:
instructions executable by a first circuit block to couple a first storage circuit in a first data path to a first input of a first logic circuit, wherein the first multiplexer circuit is coupled to an output of the first storage circuit, wherein a second storage circuit is coupled to the output of the first storage circuit and to an input of the first multiplexer circuit, and wherein the first storage circuit is in the first circuit block;
instructions executable by a second circuit block to couple the second circuit block in a second data path to a second input of the first logic circuit; and
instructions executable by the first multiplexer circuit to adjust a latency of the first data path by bypassing or coupling the second storage circuit in the first data path based on an indication of whether a redundant third circuit block is coupled between the first and second circuit blocks in at least one of the first or second data paths.

* * * * *